(12) United States Patent
Yu et al.

(10) Patent No.: US 9,348,219 B2
(45) Date of Patent: May 24, 2016

(54) PATTERNED MASK USING CURED SPIN-ON-GLASS COMPOSITION

(71) Applicant: Seagate Technology LLC, Cupertino, CA (US)

(72) Inventors: Zhaoning Yu, Palo Alto, CA (US); Nobuo Kurataka, San Jose, CA (US); Gennady Gauzner, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/612,145

(22) Filed: Feb. 2, 2015

(65) Prior Publication Data

US 2015/0155164 A1    Jun. 4, 2015

Related U.S. Application Data

(62) Division of application No. 13/798,130, filed on Mar. 13, 2013, now abandoned.

(60) Provisional application No. 61/672,271, filed on Jul. 16, 2012.

(51) Int. Cl.

| | | |
|---|---|---|
| G03F 7/00 | (2006.01) | |
| C09K 13/00 | (2006.01) | |
| G03F 7/40 | (2006.01) | |
| G11B 5/74 | (2006.01) | |
| G11B 5/855 | (2006.01) | |

(52) U.S. Cl.
CPC .............. *G03F 7/0002* (2013.01); *C09K 13/00* (2013.01); *G03F 7/40* (2013.01); *G11B 5/746* (2013.01); *G11B 5/855* (2013.01)

(58) Field of Classification Search
None
See application file for complete search history.

(56) References Cited

U.S. PATENT DOCUMENTS

| | | | | |
|---|---|---|---|---|
| 5,464,662 A | | 11/1995 | Murakami | |
| 6,080,526 A | * | 6/2000 | Yang | H01L 21/02134 257/E21.259 |
| 7,396,475 B2 | * | 7/2008 | Sreenivasan | B81C 1/0046 216/11 |
| 7,585,424 B2 | * | 9/2009 | Mei | H01L 51/0017 205/118 |
| 8,128,832 B2 | * | 3/2012 | DiPietro | B82Y 10/00 216/41 |
| 9,105,295 B2 | * | 8/2015 | Albrecht | G11B 5/82 |
| 2002/0168873 A1 | * | 11/2002 | Ahn | H01L 21/31053 438/781 |
| 2005/0069732 A1 | * | 3/2005 | Kamata | B82Y 10/00 428/835 |
| 2007/0090087 A1 | * | 4/2007 | Shirotori | B82Y 10/00 216/22 |
| 2010/0020443 A1 | * | 1/2010 | Albrecht | B82Y 10/00 360/135 |
| 2010/0040838 A1 | | 2/2010 | Abdallah et al. | |
| 2011/0235212 A1 | * | 9/2011 | Sakurai | B82Y 10/00 360/135 |
| 2012/0080402 A1 | * | 4/2012 | Xu | G11B 5/743 216/22 |
| 2012/0123135 A1 | * | 5/2012 | Bradford | C08G 77/18 549/214 |
| 2012/0126358 A1 | * | 5/2012 | Arnold | H01L 21/0337 257/499 |

(Continued)

FOREIGN PATENT DOCUMENTS

| | | |
|---|---|---|
| CN | 101023042 | 8/2007 |
| CN | 102308260 | 1/2012 |

*Primary Examiner* — Anita Alanko

(57) ABSTRACT

Provided herein are methods for depositing a spin-on-glass composition over an imprinted resist; curing the spin-on-glass composition to form a cured spin-on-glass composition; and forming a patterned mask by etching the cured spin-on-glass composition, the resist, and an underlying mask composition, wherein the patterned mask comprises features of the cured spin-on-glass composition atop the mask composition, and wherein curing the spin-on-glass composition is configured to prevent shifting or toppling of the spin-on glass composition from atop the mask composition while forming the patterned mask.

17 Claims, 21 Drawing Sheets

(56) References Cited

U.S. PATENT DOCUMENTS

2013/0016444 A1* 1/2013 Grobis ............... G11B 5/59688
　　　　　　　　　　　　　　　　　　　360/294

2013/0193103 A1* 8/2013 Van de Veerdonk ...... C25F 3/00
　　　　　　　　　　　　　　　　　　　216/11

* cited by examiner

PATTERNED MASK USING CURED SPIN-ON-GLASS COMPOSITION

CROSS-REFERENCE

This application is a division of U.S. patent application Ser. No. 13/798,130, filed Mar. 13, 2013, which claims the benefit of U.S. Provisional Patent Application 61/672,271 filed Jul. 16, 2012.

BACKGROUND

Imprint resists are mainly designed to optimize their feature filling and release properties; they usually do not provide sufficient mechanical stability and etch resistance.

DRAWINGS

DESCRIPTION

In a following description, reference is made to the accompanying drawings, which form a part hereof, and in which is shown by way of illustration a specific example in which the invention may be practiced. It is to be understood that other embodiments may be utilized and structural changes may be made without departing from the scope of the present invention.

General Overview:

It should be noted that the descriptions that follow, for example, in terms of an electron curing a reverse-tone process is described for illustrative purposes and the underlying system may apply to any number and multiple types of reverse-tone processes.

In an embodiment the fabrication of BPM pattern at various densities including 250 Gb/in$^2$, 450 Gb/in$^2$, 500 Gb/in$^2$, 1 Tb/in$^2$, 1.5 Tb/in$^2$ and 2 Tb/in$^2$ to 5 Tb/in$^2$ uses a "reverse-tone" process including a wet reverse-tone process, in which a silicon-rich, etch-resistant material (such as HSQ) is deposited including spin-coated on a resist pattern and then etched back through multi-step reactive ion etching (RIE) to form a negative tone replica of the original.

In some embodiments increasing areal density may cause narrowing of the process window feature mechanical instability during etch-back may increase dot placement error (the "shifting dots" problem), insufficient etch resistance, and non-homogeneity of resist material at this scale degrades the dot size uniformity.

Figure 1:
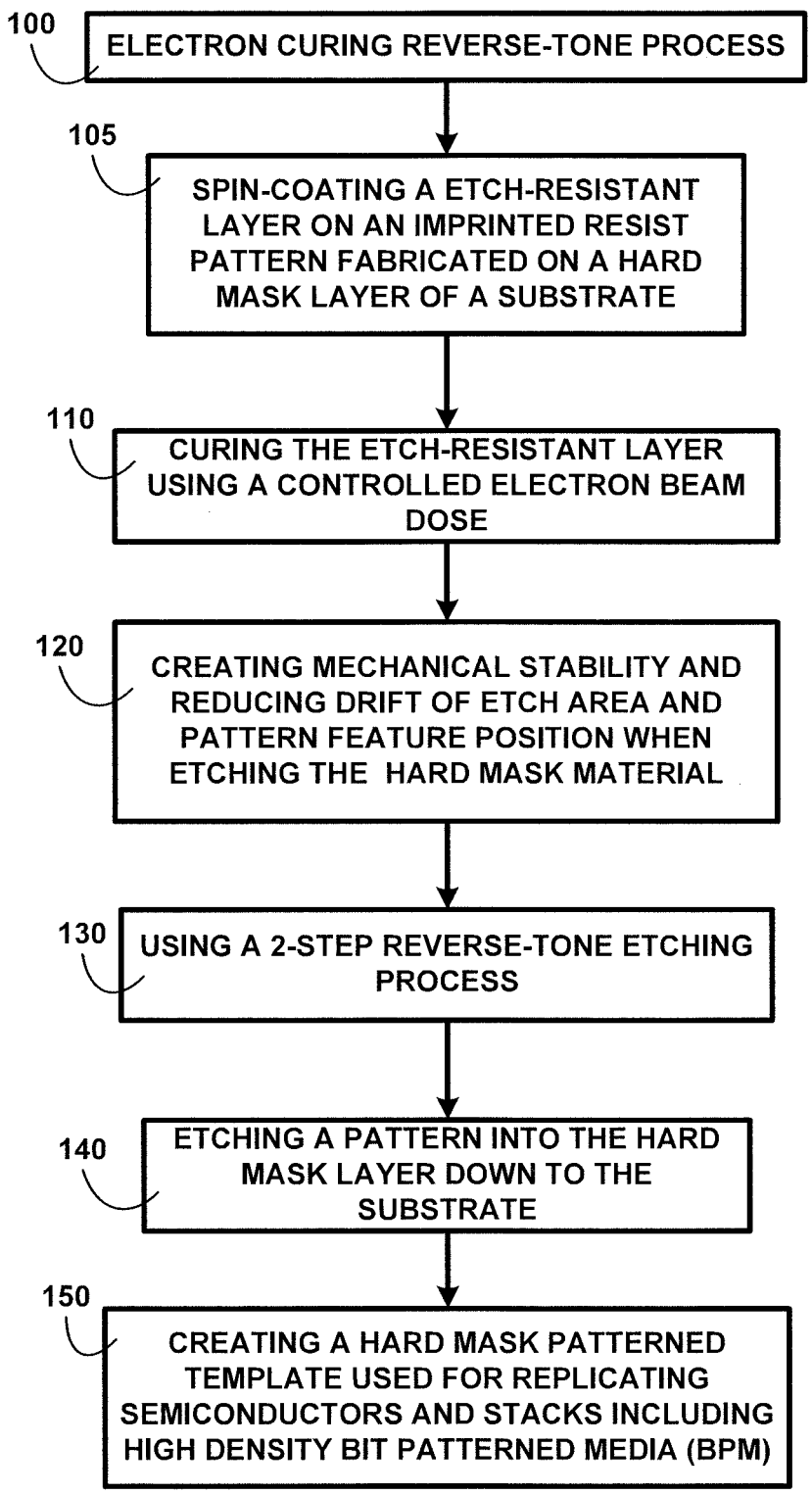
FIG. 1 shows a block diagram of an overview of an electron curing reverse-tone process of one embodiment.

FIG. 1 shows a block diagram of an overview of an electron curing reverse-tone process of one embodiment. FIG. 1 shows an electron curing reverse-tone process 100 which begins with a process for example spin-coating an etch-resistant layer on an imprinted resist pattern fabricated on a hard mask layer of a substrate 105.

The etch-resistant layer covers and fills the pattern features of the imprinted resist pattern. A controlled electron beam dose is used for curing the etch-resistant layer using a controlled electron beam dose 110 that structurally transforms the etch-resistant layer material. The curing may be done alternatively before or after the spin on glass (SOG) etch-back, the two alternatives lead to different characteristics in the results, but both increase the pattern quality. The electron beam curing structural transformation is creating mechanical stability and reducing drift of etch area and pattern feature position when etching the hard mask material 120. Etching the hard mask material is achieved using a 2-step reverse-tone etching process 130. A first predefined etch performs an etch-back of the electron beam cured etch-resistant layer to expose the imprinted resist pattern.

A second predefined etch is used for removing the imprinted resist and etching a pattern into the hard mask layer down to the substrate 140. The second predefined etch removes the imprinted resist pattern and forms a negative tone replica of the original pattern. The remaining electron beam cured etch-resistant layer can be removed creating a hard mask patterned template used for replicating semiconductors and stacks including high density bit patterned media (BPM) 150. The removal of the electron beam cured etch-resistant layer includes using a wet-chemical process such as sodium hydroxide (NaOH). Alternatively the remaining HSQ itself is used as part of the mask for the etching of the underlying stack or semiconductor. Replicating stacks including high density bit patterned media (BPM) includes using the mask for etching of magnetic layers of stacks by ion beam etching.

DETAILED DESCRIPTION

Figure 2:
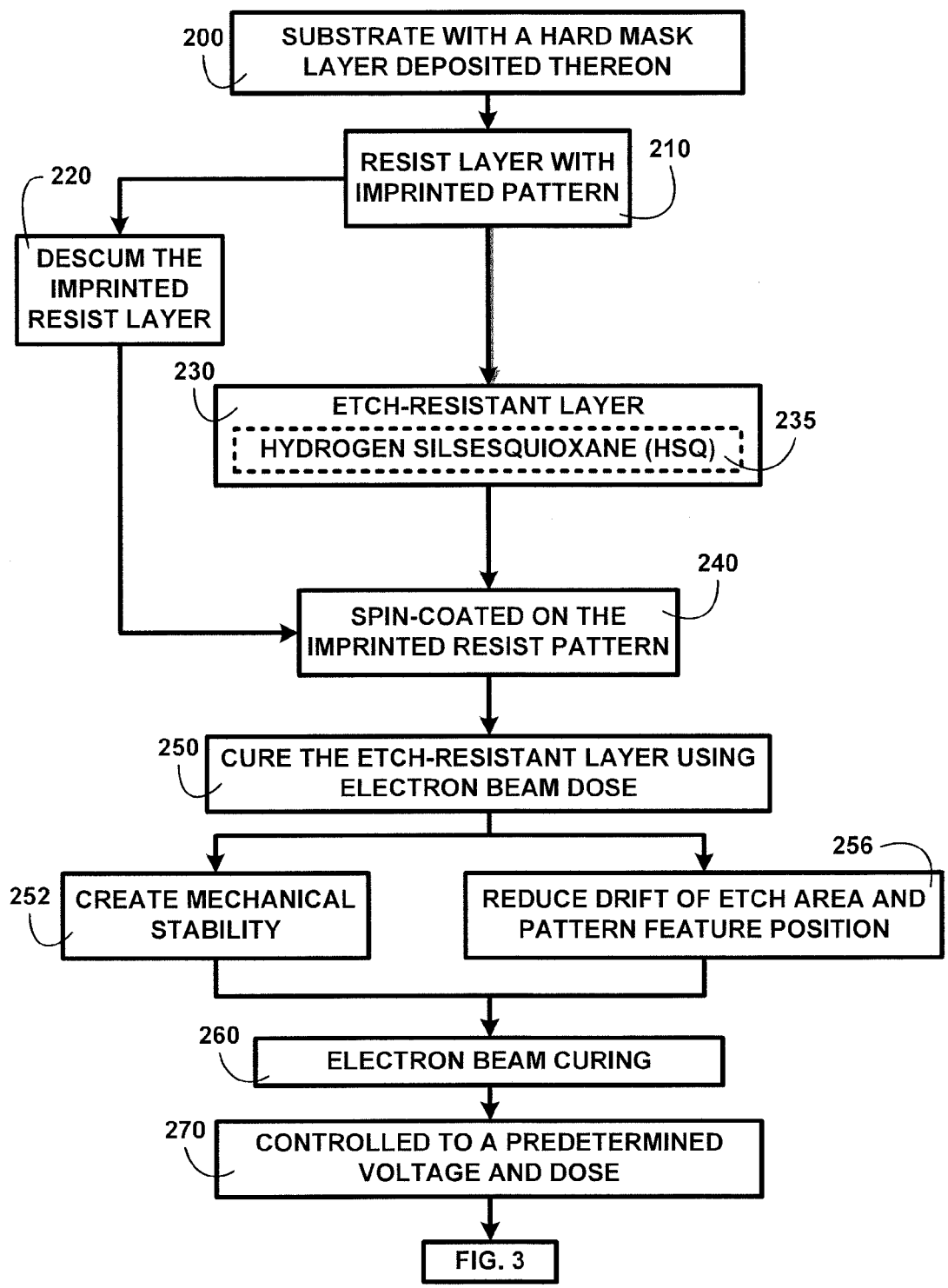
FIG. 2 shows a block diagram of an overview flow chart of an electron curing reverse-tone process of one embodiment.

Controlled Electron Beam Curing Process:

FIG. 2 shows a block diagram of an overview flow chart of an electron curing reverse-tone process of one embodiment. FIG. 2 shows a substrate with a hard mask layer deposited thereon 200. A resist layer with imprinted pattern 210 is fabricated on the hard mask layer, established for example by an ultraviolet (UV)-imprint process. A process may be used to descum the imprinted resist layer 220 to reduce the residual resist layer. The descum process removes a portion of the resist material exposing the hard mask layer between pattern features. Alternatively in one embodiment the imprinted resist layer is not descummed to avoid any potential alterations in the imprinted pattern. An etch-resistant layer 230 including hydrogen silsesquioxane (HSQ) 235 is deposited including spin-coated on the imprinted resist pattern 240.

An apparatus is used to cure the etch-resistant layer using electron beam dose 250 which is controlled to create mechanical stability 252 in the etch-resistant layer. The mechanical stability will reduce drift of etch area and pattern feature position 256. The electron beam curing dose is controlled to a predetermined voltage and dose 270 to achieve electron beam curing 260 of the etch-resistant layer material. The predetermined voltage 303 of FIG. 3 may include electron beam irradiated at an acceleration voltage. The acceleration voltage affects electron penetration depth. The sample structure in part is used in the determination of the predetermined voltage including acceleration voltages of several hundred volts, 2 kV, 3 kV, 10, 20, 50 and 100 kV. The electron beam curing may cause the hydrogen silsesquioxane (HSQ) to change from the "cage" structure to a cross-linked "network" structure, shrinks its volume and may increase its density, resulting in a HSQ film of higher etch resistance and better homogeneity. Description of the processing continues in FIG. 3.

Figure 3:
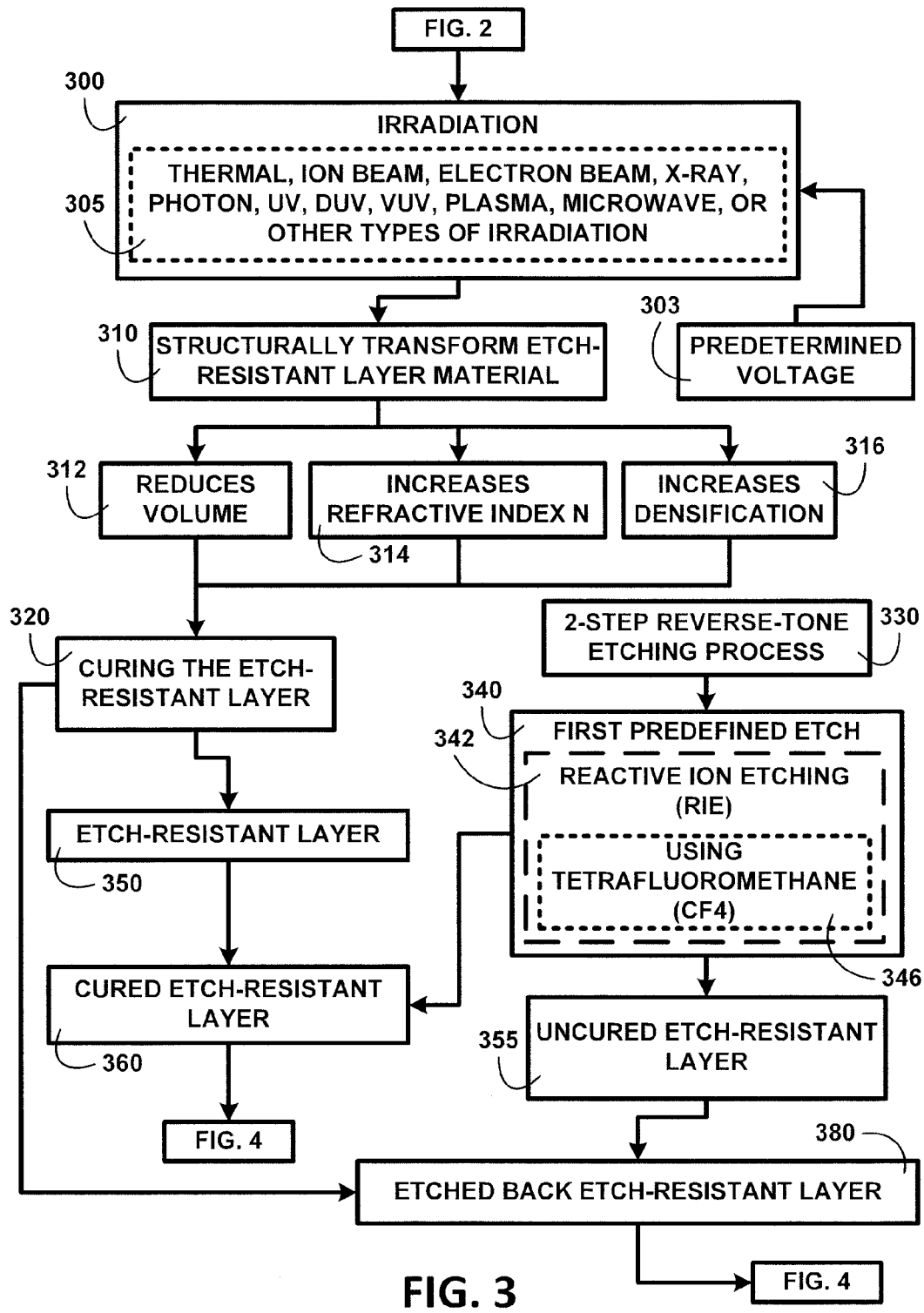
FIG. 3 shows a block diagram of an overview flow chart of a continuation of an electron curing reverse-tone process of one embodiment.

First Predefined Etch:

FIG. 3 shows a block diagram of an overview flow chart of a continuation of an electron curing reverse-tone process of one embodiment. FIG. 3 shows a description processes the continue from FIG. 2 including the controlled electron beam irradiation 300 including thermal, ion beam, electron beam, x-ray, photon, ultraviolet (UV), deep ultraviolet (DUV), vacuum ultraviolet (VUV), plasma, microwave, or other types of irradiation 305.

The controlled electron beam dose uses a predetermined voltage 303 for an acceleration voltage. The electron beam irradiation 300 is used to structurally transform etch-resistant layer material 310 which reduces volume 312, increases refractive index N 314 and increases densification 316.

In one embodiment curing the etch-resistant layer 320 is performed on the etch-resistant layer 350. The electron beam irradiation step is added before a reverse-tone process including a 2-step etch-back and etching. The curing may increase the mechanical stability of the HSQ features during the 2-step reverse-tone processing, thus greatly alleviating the "shifting dots" problem. When the e-beam treatment is performed before the HSQ etch-back, the process tends to produce features with bigger size.

After curing the etch-resistant layer 320 a 2-step reverse-tone etching process 330 is used to etch the hard mask material. A first predefined etch 340 including reactive ion etching (RIE) 342 using tetrafluoromethane ($CF_4$) 346 is used to etch-back cured etch-resistant layer 360. This embodiment continues as described in FIG. 4.

In another embodiment before the electron beam curing process the first predefined etch 340 is used to etch-back the uncured etch-resistant layer 355.

The electron beam curing 260 of FIG. 2 is used for curing the etch-resistant layer 320 in the etched back etch-resistant layer 380. The 2-step reverse-tone etching process 330 continues as described in FIG. 4.

Figure 4:
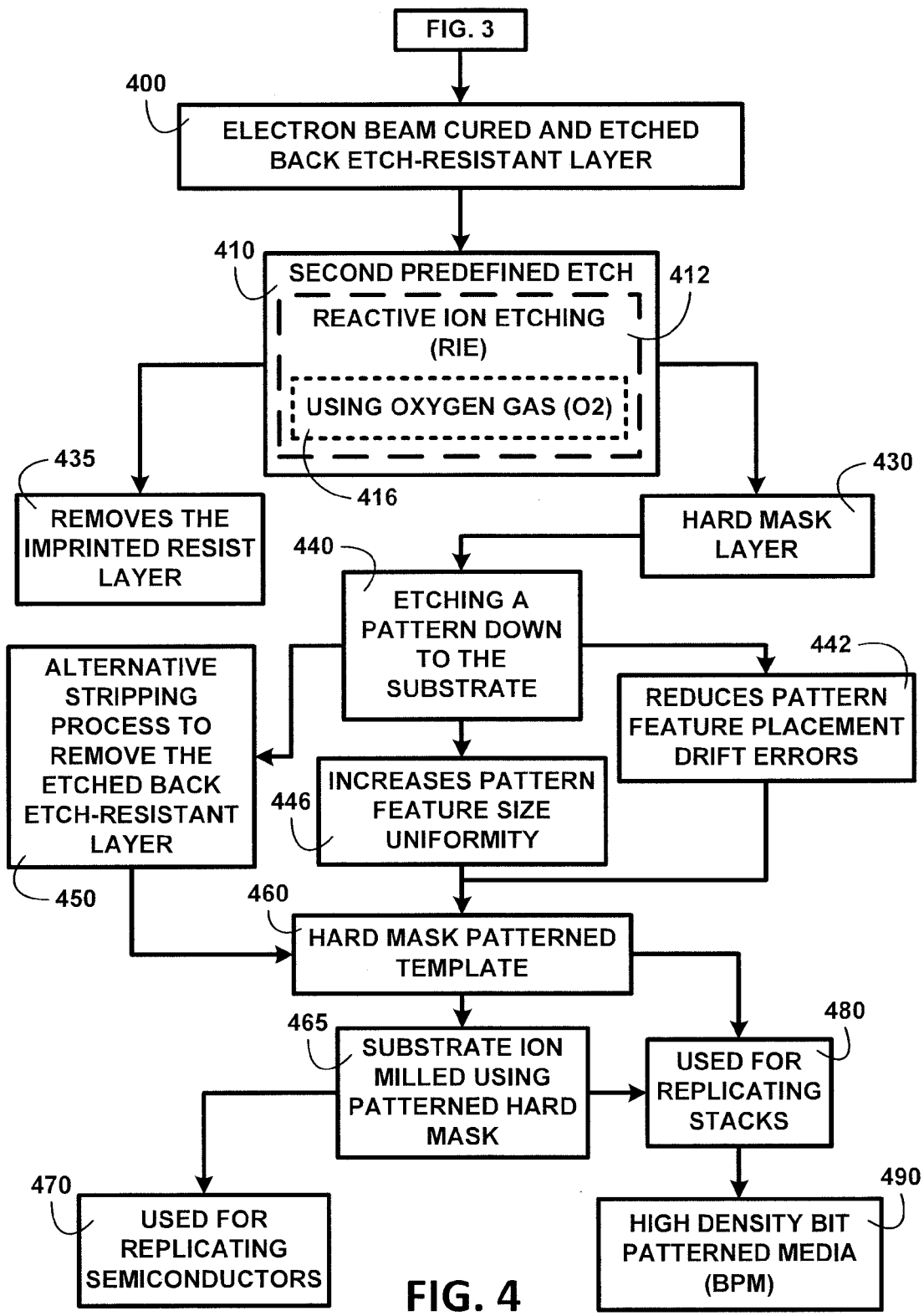
FIG. 4 shows a block diagram of an overview flow chart of a second continuation of an electron curing reverse-tone process of one embodiment.

Second Predefined Etch:

FIG. 4 shows a block diagram of an overview flow chart of a second continuation of an electron curing reverse-tone process of one embodiment. FIG. 4 shows subsequent processing continuing from FIG. 3. The two embodiments of the electron curing reverse-tone process 100 processing up to this point both produce electron beam cured and etched back etch-resistant layer 400. The 2-step reverse-tone etching process 330 of FIG. 3 continues with a second predefined etch 410 including reactive ion etching (RIE) 412 using oxygen gas ($O_2$) 416.

The second predefined etch 410 performs an etch of a hard mask layer 430 and removes the imprinted resist layer 435. This process is etching a pattern down to the substrate 440. The electron beam cured and etched back etch-resistant layer reduces pattern feature placement drift errors 442 and increases pattern feature size uniformity 446. The remaining HSQ itself can be used as part of the mask for the etching of the underlying stack or semiconductor. The second predefined etch 410 can alternatively be followed by a stripping process to remove the etched back etch-resistant layer 450 and forming a negative tone replica of the original pattern.

The etched hard mask including a carbon hard mask layer and alternatively including the etched back electron beam cured etch-resistant layer create a hard mask patterned template 460. In one embodiment subsequent processes include a substrate ion milled using patterned hard mask 465 for patterning of the substrate including a BPM magnetic stack. The resulting hard mask patterned template 460 may be used for subsequent replication of high-density (>1 $Tb/in^2$) patterned media. BPM replicated using the hard mask patterned template produced by the electron curing reverse-tone process 100 may have 1.5 $Tb/in^2$ density, corresponding to a minimum dot-to-dot distance of 22.1 nm. The electron curing reverse-tone process 100 increases the quality of the replicated BPM pattern at >1 $Tb/in^2$ density, producing arrays with markedly increased dot size at a minimum dot-to-dot distance of 22.1 nm. The hard mask patterned template 460 with reduced pattern feature placement drift errors and increased pattern feature size uniformity is used for replicating semiconductors 470 and used for replicating stacks 480 including high density bit patterned media (BPM) 490. The electron curing reverse-tone process 100 creates the advantages of placement accuracy and size uniformity thereby increasing the replicated quality of semiconductors and stacks.

Figure 5A:
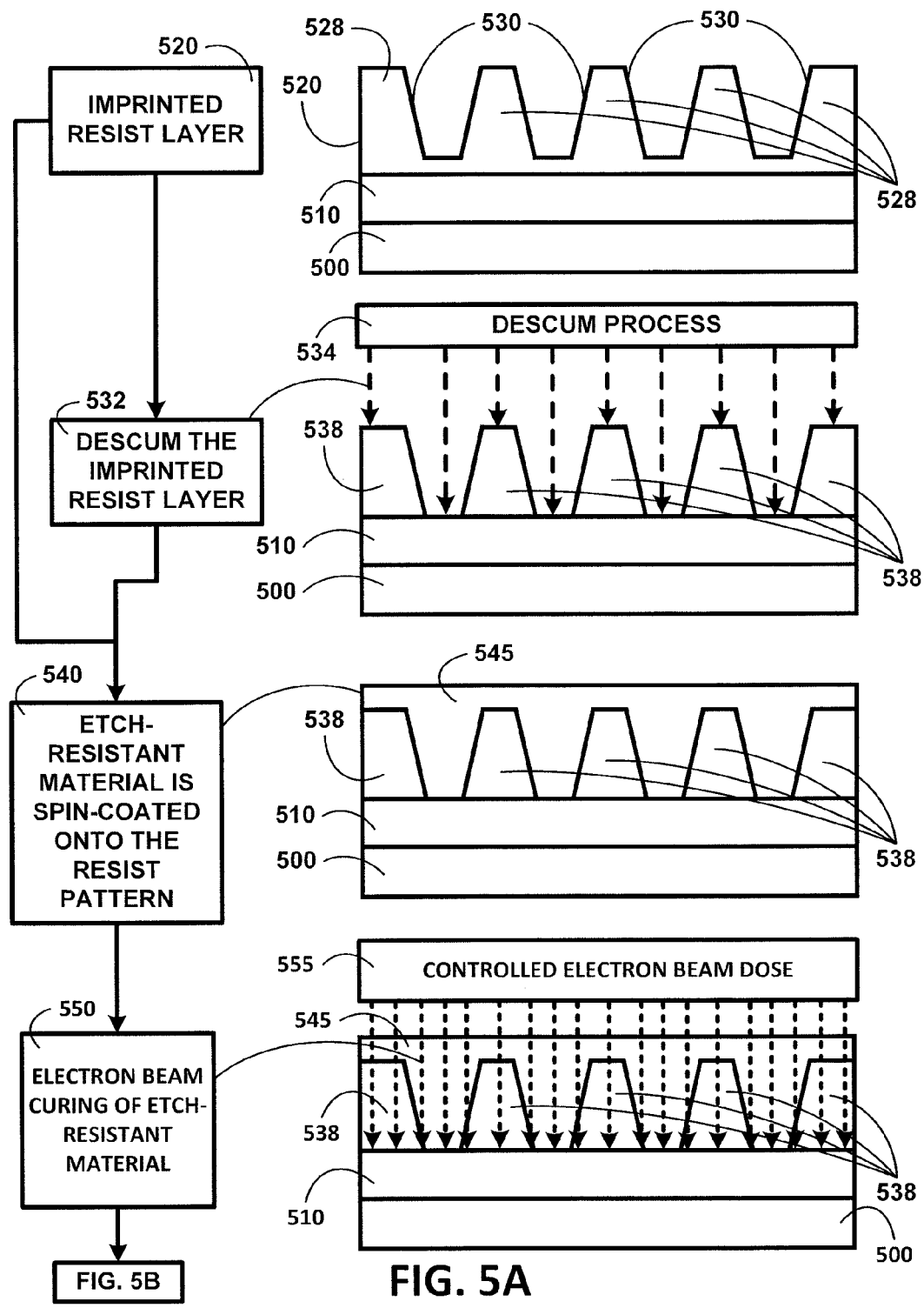
FIG. 5A shows for illustrative purposes only an example of spin coating an etch-resistant layer of one embodiment.

Spin Coating an Etch-Resistant Layer:

FIG. 5A shows for illustrative purposes only an example of spin coating an etch-resistant layer of one embodiment. FIG. 5A shows a substrate 500 with a hard mask layer 510 deposited thereon. The substrate 500 includes magnetic layers of a stack including a bit patterned media (BPM). An imprinted resist layer 520 on the hard mask layer 510 includes an array of one or more imprinted resist pattern feature 528 created using the imprinted pattern 530. Alternatively in one embodiment the imprinted resist layer is not descummed to avoid any potential alterations in the imprinted pattern and an etch-resistant material is deposited onto the resist pattern 540. The etch-resistant material deposition includes spin coating.

Figure 5B:
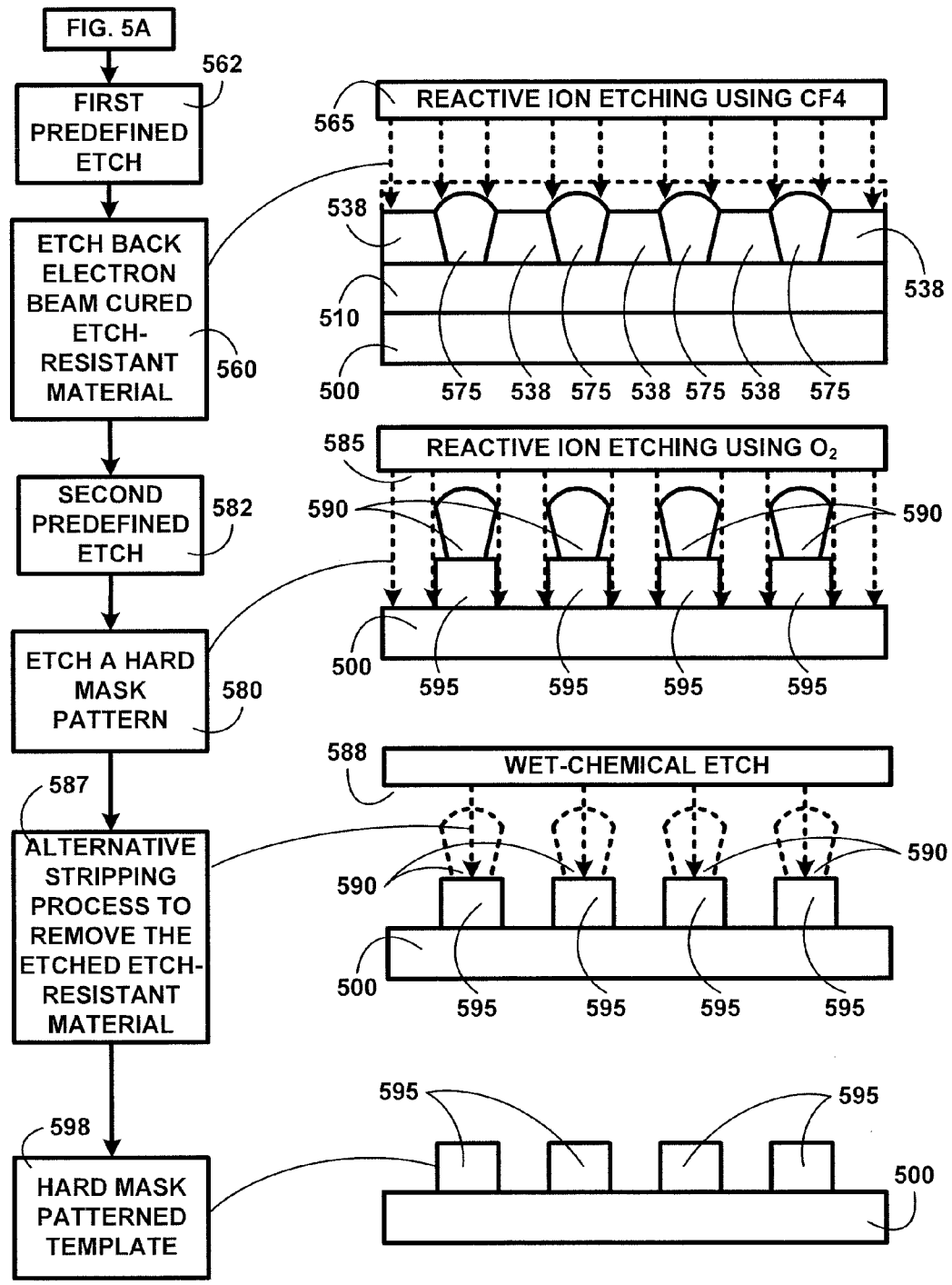
FIG. 5B shows for illustrative purposes only an example of electron beam curing of etch-resistant material of one embodiment.

A descum process 534 is used to descum the imprinted resist layer 532. The descum process 534 removes excess resist material from each pattern feature 538 and exposes portions of the hard mask layer 510. An etch-resistant material is deposited onto the resist pattern 540. An etch-resistant layer material 545 including hydrogen silsesquioxane (HSQ) 235 of FIG. 2 is used to develop mechanical stability and to reduce pattern feature placement drift error and increase pattern feature size uniformity when cured using a controlled dose of electron beams. Each pattern feature 538 is filled by the etch-resistant layer material 545 and which covers the exposed portions of the hard mask layer 510. FIG. 5B describes other processes that follow.

Electron Beam Curing:

FIG. 5B shows for illustrative purposes only an example of electron beam curing of etch-resistant material of one embodiment. FIG. 5B shows a continuation of processing from FIG. 5A. FIG. 5B shows the substrate 500, hard mask layer 510 and examples of the pattern feature 538. An electron beam curing of etch-resistant material 550 is performed using a controlled electron beam dose 555. The controlled electron beam dose 555 projects electron beams which flood the etch-resistant layer material 545. The controlled electron beam dose 555 structurally transforms the molecules of the etch-resistant layer material 545 to create mechanical stability.

The 2-step reverse-tone etching process 330 of FIG. 3 uses the first predefined etch 340 of FIG. 3 including a reactive ion etching using $CF_4$ 565. The reactive ion etching using $CF_4$ 565 is used to etch back electron beam cured etch-resistant material 560. The first predefined etch 340 of FIG. 3 creates etched back cured etch-resistant material 575.

The second predefined etch 410 of FIG. 4 of the 2-step reverse-tone etching process 330 of FIG. 3 including the reactive ion etching using $O_2$ 585 is used to etch a hard mask pattern 580. The reactive ion etching using $O_2$ 585 removes the resist material and etches into the hard mask layer 510 down to the substrate 500. Imprint resist is not etch resistant and may not serve as a good mask for some processes. However, it is easier to imprint holes in imprint resist than making resist pillars by the imprint process. A "reverse-tone" process instead of directly using the imprinted resist pattern as a etch mask uses the etch resistance material for example HSQ material to create the mask. The etched back cured etch-resistant material 575 is used to increase pattern feature placement accuracy and size uniformity. The second predefined etch 410 of FIG. 4 produces a patterned hard mask layer 595. The etched etch-resistant material 590 is removed using for example a wet-chemical etch including a NaOH solution process and reveals the patterned hard mask layer 595 on the substrate 500. The removal the etched etch-resistant material 590 for example HSQ prior to IBE of for example the magnetic stacks may tend to re-deposit the HSQ on the final product during IBE, leaving a layer of unwanted coating.

Alternatively the etched etch-resistant material 590 removal process is not included where by the remaining etch-resistant material 590 for example HSQ is used as part of the mask as well. A subsequent process including using a RIE process is used to transfer the pattern into an underlying Si substrate followed by a process to remove the HSQ/carbon mask stack. The patterned hard mask layer 595 on the substrate 500 creates a hard mask patterned template 598. The hard mask patterned template 598 is used for used for replicating semiconductors and stacks including high density bit patterned media (BPM).

Figure 6A:
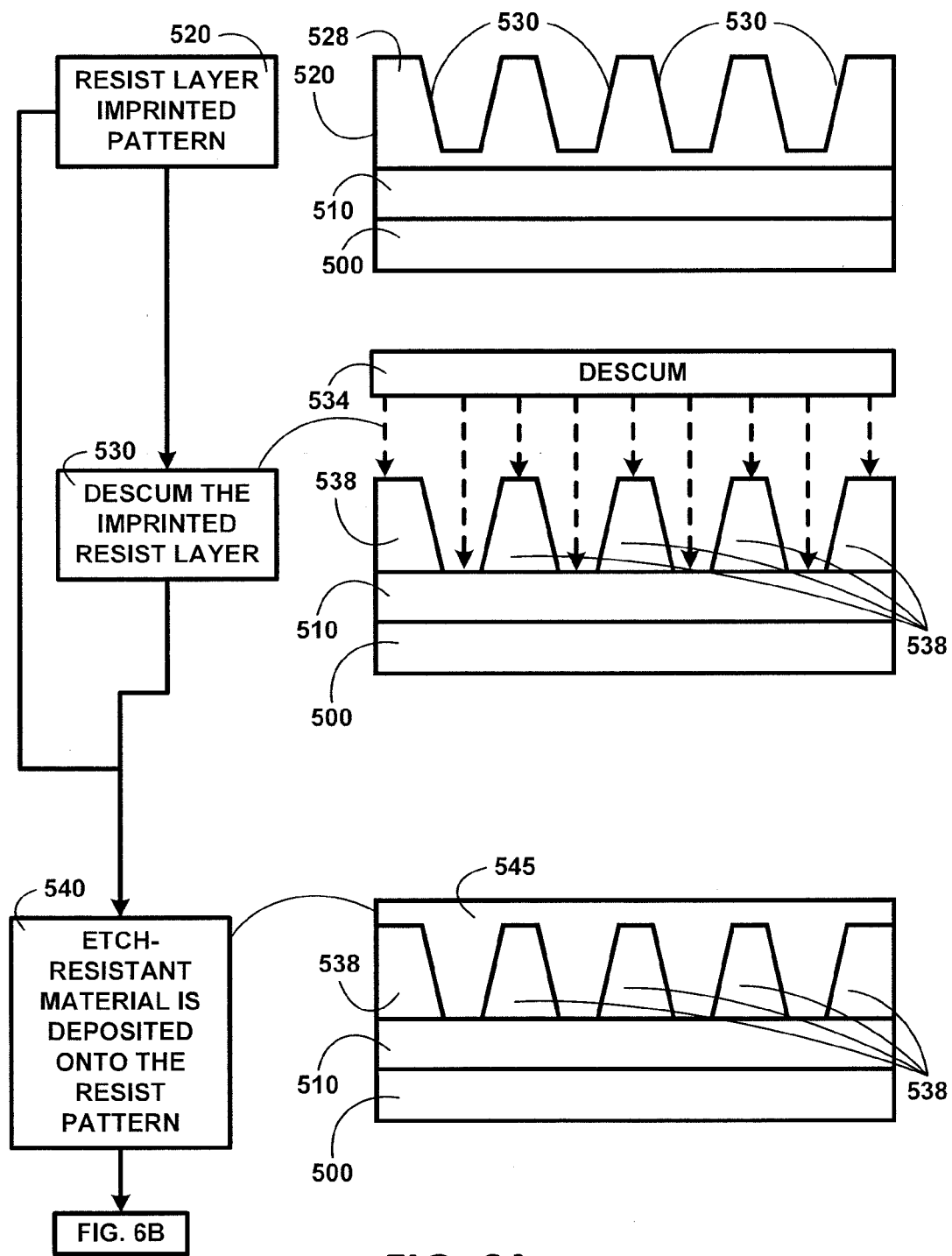
FIG. 6A shows for illustrative purposes only an example of resist layer imprinted pattern of one embodiment.

Resist Layer Imprinted Pattern:

FIG. 6A shows for illustrative purposes only an example of resist layer imprinted pattern of one embodiment. FIG. 6A shows the substrate 500, deposited hard mask layer 510 and imprinted resist layer 520. The imprinted pattern 530 creates each imprinted resist pattern feature 528. The descum process 534 is used to descum the imprinted resist layer 532. The descum process 534 removes excess resist from the pattern feature 538 and removes resist down to the hard mask layer 510. Alternatively in one embodiment the imprinted resist layer is not descummed to avoid any potential alterations in the imprinted pattern. Processing continues wherein etch-resistant material is deposited onto the resist pattern 540. The etch-resistant layer material 545 covers any exposed surface of the hard mask layer 510 and fills each pattern feature 538. Descriptions of continuing processes are shown in FIG. 6B.

Figure 6B:
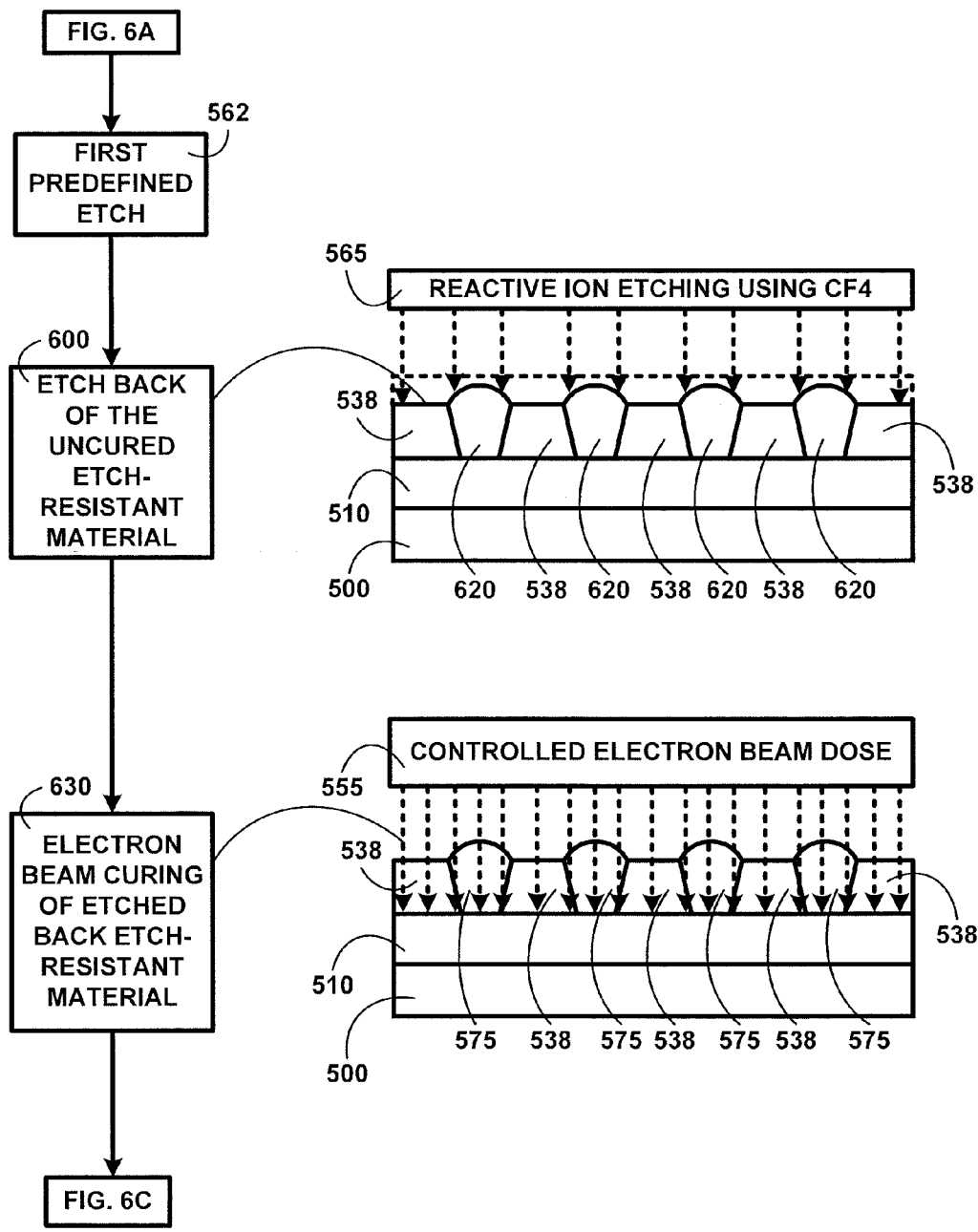
FIG. 6B shows for illustrative purposes only an example of 2-step reverse-tone etching process of one embodiment.

2-Step Reverse-Tone Etching Process:

FIG. 6B shows for illustrative purposes only an example of 2-step reverse-tone etching process of one embodiment. FIG. 6B shows processes continuing from FIG. 6A. FIG. 6B shows another embodiment of the electron curing reverse-tone process 100. The substrate 500 has the deposited hard mask layer 510 upon which are the uncured etch resistant material and descummed patterned resist.

In this embodiment the 2-step reverse-tone etching process 330 of FIG. 3 uses the first predefined etch 340 of FIG. 3 before the electron beam curing process. The first predefined etch 340 of FIG. 3 includes the reactive ion etching using $CF_4$ 565 used to process an etch-back of the uncured etch-resistant material 600. The reactive ion etching using $CF_4$ 565 produces etched back uncured etch-resistant material 620.

The controlled electron beam dose 555 is used for electron beam curing of etched back etch-resistant material 630. The electron beam curing process results in etched back cured etch-resistant material 575. The etched back cured etch-resistant material 575 has structurally transformed molecules with increased mechanical stability. Descriptions of subsequent processes are shown in FIG. 6C.

Figure 6C:
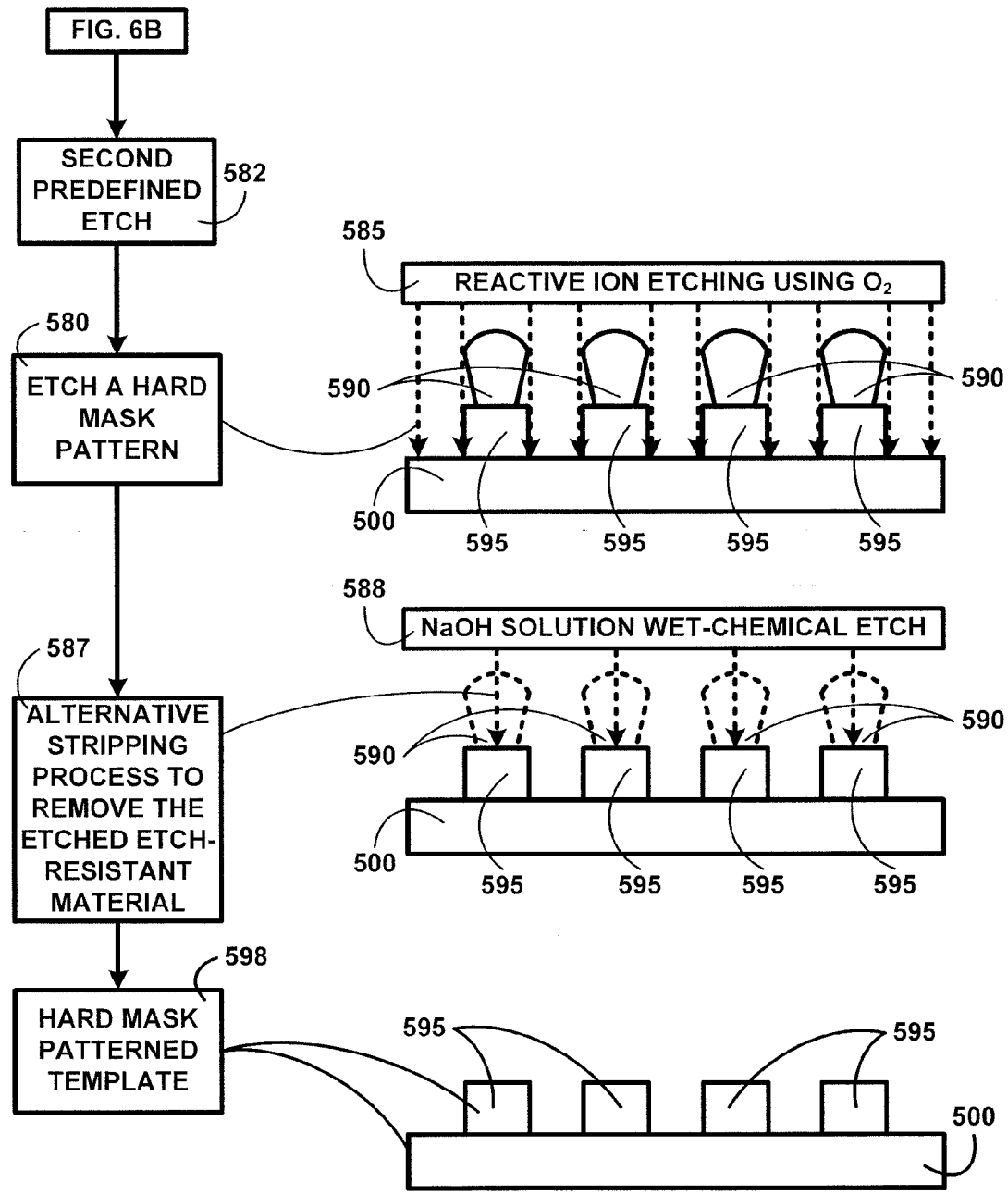
FIG. 6C shows for illustrative purposes only an example of an electron beam cured hard mask patterned template of one embodiment.

Hard Mask Patterned Template:

FIG. 6C shows for illustrative purposes only an example of an electron beam cured hard mask patterned template of one embodiment. In this embodiment the 2-step reverse-tone etching process 330 of FIG. 3 includes using the second predefined etch 410 of FIG. 4 including the reactive ion etching using $O_2$ 585 after the electron beam curing process. The reactive ion etching using $O_2$ 585 is used to etch a hard mask pattern 580 down to the substrate 500. The reactive ion etching using $O_2$ 585 removes the imprinted resist layer. The reactive ion etching using $O_2$ 585 produces a patterned hard mask layer 595. The etched etch-resistant material 590 is used to increase pattern feature placement accuracy and size uniformity.

Following the reactive ion etching using $O_2$ 585, an alternative stripping process is used to remove the etched etch-resistant material 587 including a NaOH solution wet-chemical etch 588 removes the etched etch-resistant material 590. In the alternate the remaining HSQ itself is used as part of the mask for the etching of the underlying stack or semiconductor. The patterned hard mask layer 595 on the substrate 500 creates the hard mask patterned template 598 used for replicating semiconductors 470 of FIG. 4 and used for replicating stacks 480 of FIG. 4 including high density bit patterned media (BPM) 490 of FIG. 4.

Figure 7A:
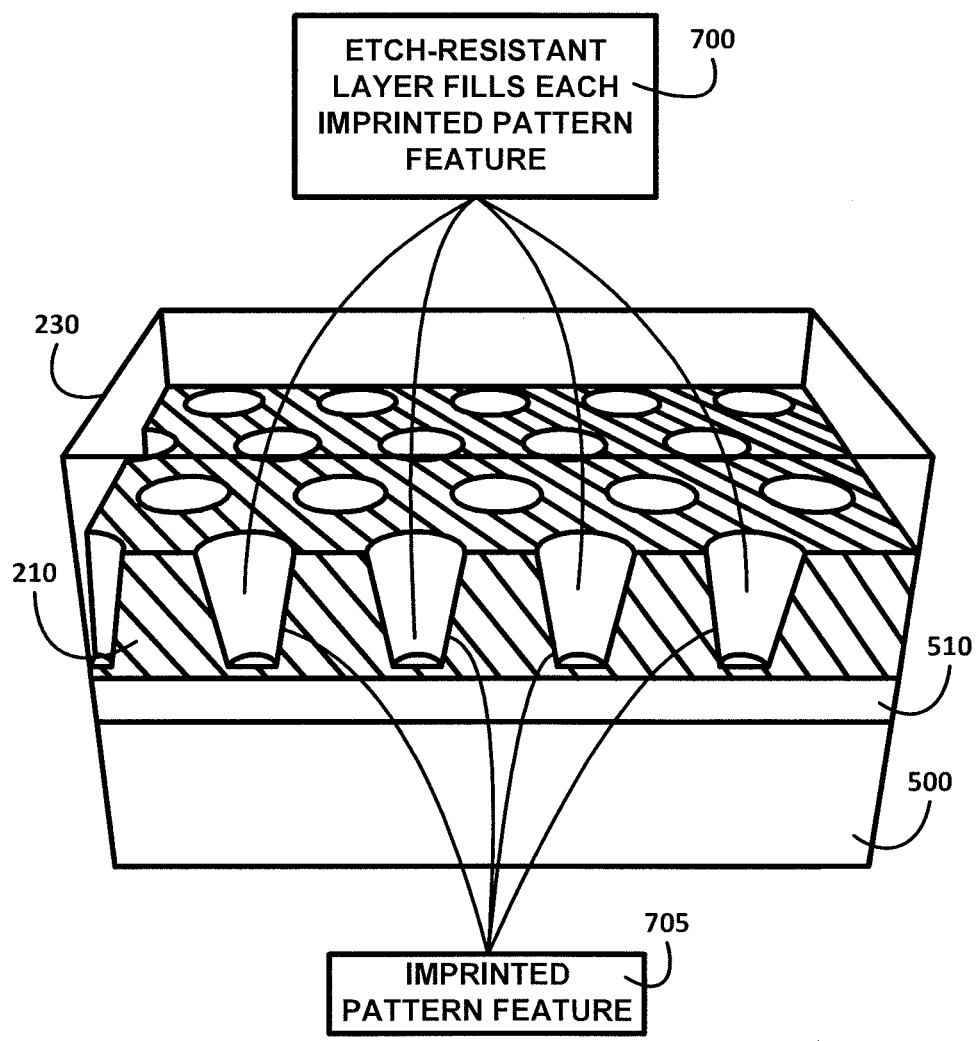
FIG. 7A shows for illustrative purposes only an example of etch-resistant layer filled imprinted pattern features of one embodiment.

Etch-Resistant Layer Filled Imprinted Pattern Features:

FIG. 7A shows for illustrative purposes only an example of etch-resistant layer filled imprinted pattern features of one embodiment. FIG. 7A shows the substrate 500 with the hard mask layer 510 deposited thereon. The resist layer with imprinted pattern 210 includes multiples of an imprinted pattern feature 705 which in this example is an inverted tapered pillar. The etch-resistant layer 230 spin coated on the imprinted resist covers the resist material. The etch-resistant material including HSQ of an etch-resistant layer fills each imprinted pattern feature 700 of one embodiment.

Figure 7B:
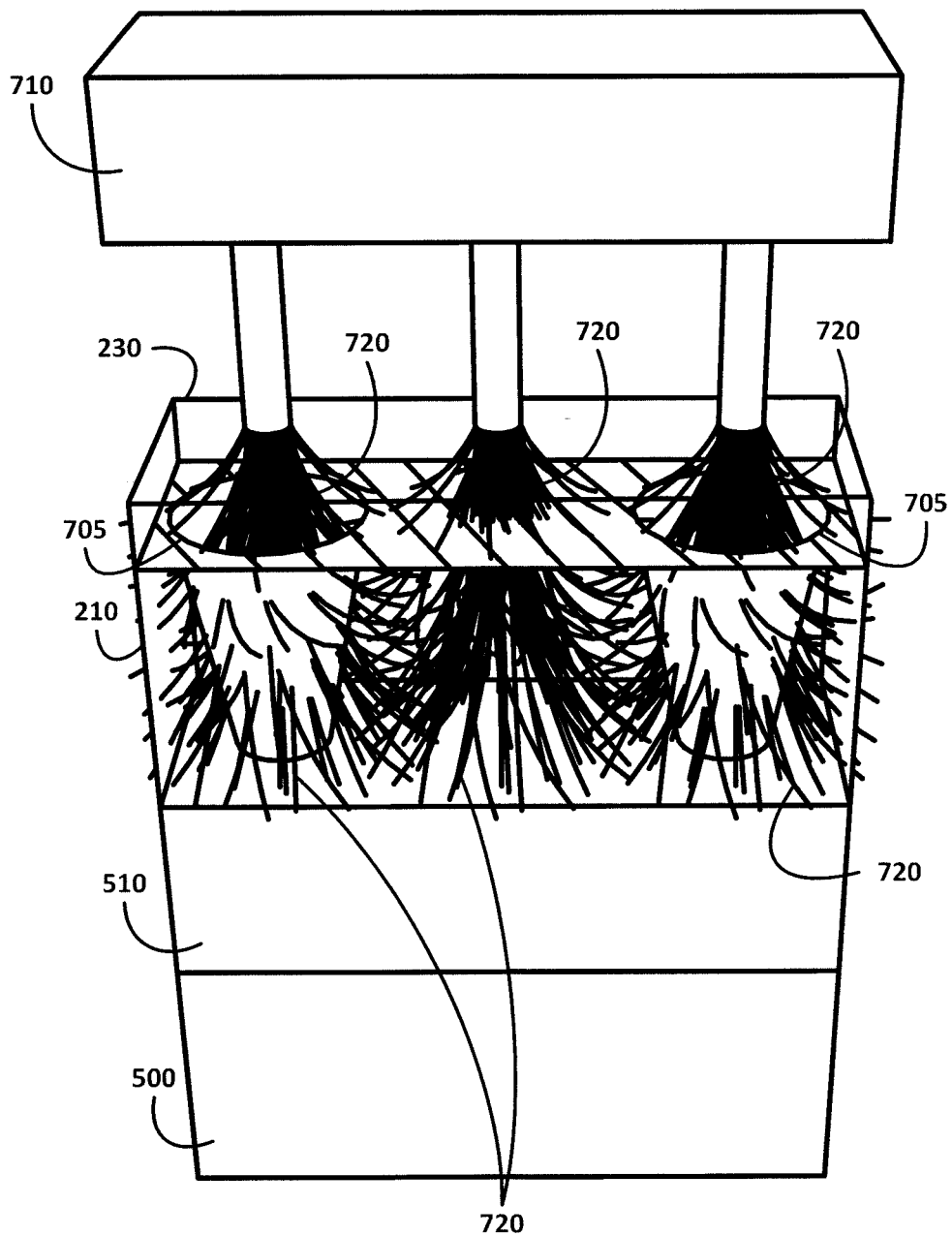
FIG. 7B shows for illustrative purposes only an example of electron beam curing of one embodiment.

Electron Beam Curing:

FIG. 7B shows for illustrative purposes only an example of electron beam curing of one embodiment. FIG. 7B shows the substrate 500 with the hard mask layer 510 deposited thereon. An example of an imprinted pattern feature 705 is shown through the etch-resistant layer 230 including HSQ is shown as transparent for ease of viewing. The etch-resistant material has filled each imprinted pattern feature 705 embedding the etch-resistant material in the resist matrix.

A controlled electron beam emitting apparatus 710 is used to produce for example flooding electron beams 720 into the etch-resistant layer 230. The flooding electron beams 720 diffuse as they penetrate the etch-resistant material. The controlled electron beam emitting apparatus 710 regulates the strength of the emitted electron beams using a predetermined voltage and dose. The predetermined voltage is controlled to enable the flooding electron beams 720 to saturate the volume and depth of the etch-resistant layer 230 thus curing the etch-resistant materials to structurally transform the molecules of the etch-resistant layer 230.

The etch-resistant layer 230 using HSQ is structurally transformed at a curing dose including ~1000 $\mu C/cm^2$ to 50,000 $\mu C/cm^2$. The process affected by the changes in HSQ properties includes the toppling and shifting in HSQ pillars and the strength and adhesion may help the pillars stand including stress vs. strength, and material failure. The molecular structural transformation reduces volume 312 of FIG. 3, increases refractive index n 314 of FIG. 3 and increases densification 316 of FIG. 3 of the etch-resistant layer 230. The transformed electron beam cured etch-resistant layer 230 has increased mechanical stability. Etching through the cured etch-resistant layer 230 produces reduced pattern feature placement drift error and increased pattern feature size uniformity.

Figure 8:
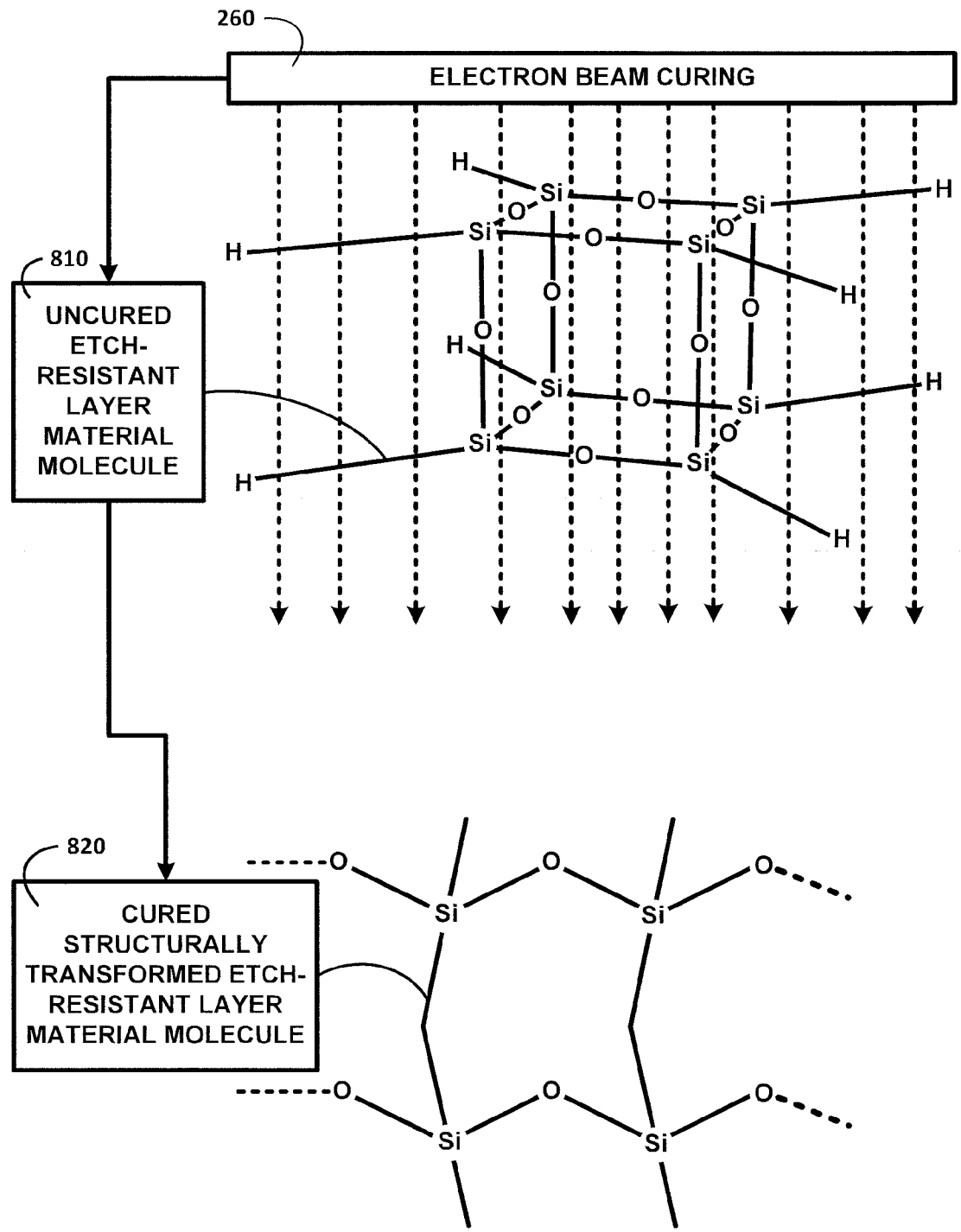
FIG. 8 shows for illustrative purposes only an example of a cured structurally transformed etch-resistant layer material molecule of one embodiment.

Electron Beam Curing Structural Transformation:

FIG. 8 shows for illustrative purposes only an example of a cured structurally transformed etch-resistant layer material molecule of one embodiment. FIG. 8 shows controlled electron beam dose 555 of FIG. 5B produces electron beam curing 260 directed into an uncured etch-resistant layer material molecule 810. An uncured etch-resistant layer material molecule of a silicon-rich, etch-resistant material including HSQ has a "cage" or cubic structure. The organic resist material is already cross-linked during the UV-imprint process. The electron beam has effects on the imprint resist as well. If electron-beam exposure is done on a UV-cured imprint resist film only, the resist seems first to turn more carbon-like (with increased refractive index and reduced thickness). At very high electron beam doses, the resist film starts to disappear. However, these effects do not render the cured HSQ 2-step reverse-tone process un-workable. The molecule has silicon (Si) atoms at each corner which are linked by oxygen (O) atoms. A hydrogen (H) atom is attached to each silicon (Si) atom adding to the volume of the molecule.

Each cured structurally transformed etch-resistant layer material molecule 820 has a cross-linked "network" structure caused by an atomic redistribution reaction. The etch-resistant layer 545 using for example HSQ is structurally transformed at a curing dose of for an example in ranges from 1,000 $\mu C/cm^2$ to 50,000 $\mu C/cm^2$. The electron beam curing structural transformation shrinks the molecule's volume and increases its density resulting in increased etch resistance. The electron beam curing increased etch resistance creates mechanical stability preventing pattern feature shifts in position and size degradations during etching. This advantage of electron beam curing produces replications of pattern feature arrays with markedly increased placement accuracy and size uniformity increasing the quality of replications for example semiconductors and stacks including BPM patterned at >1 $Tb/in^2$ density.

Figure 9:
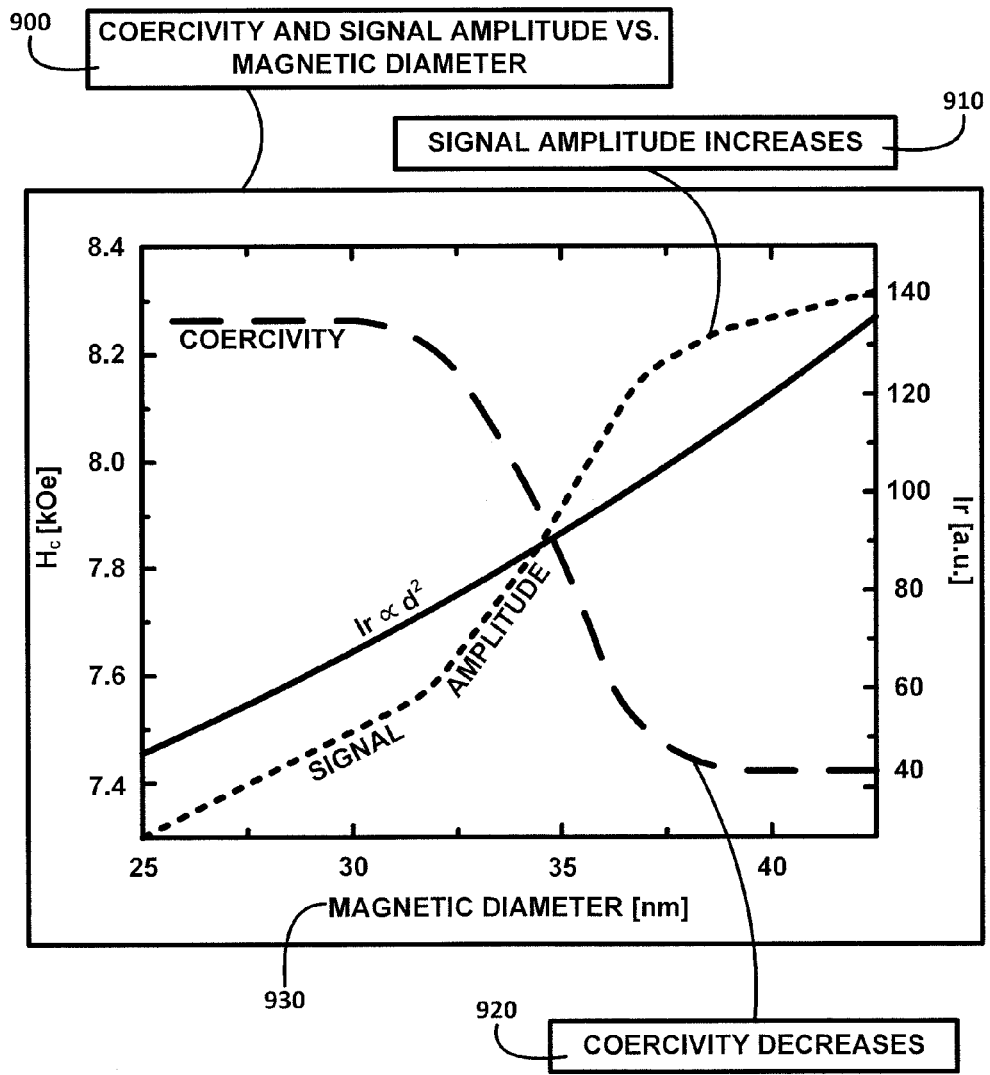
FIG. 9 shows for illustrative purposes only an example of coercivity and signal amplitude vs. magnetic diameter advantages of the electron curing reverse-tone process of one embodiment.

Coercivity and Signal Amplitude Vs. Magnetic Diameter:

FIG. 9 shows for illustrative purposes only an example of coercivity and signal amplitude vs. magnetic diameter advantages of the electron curing reverse-tone process of one embodiment. FIG. 9 shows a chart plotting the coercivity and signal amplitude vs. magnetic diameter 900. The chart shows that signal amplitude increases 910 and coercivity decreases 920 as the magnetic diameter [nm] 930 increases. The electron curing reverse-tone process 100 reduces pattern feature placement drift errors 442 of FIG. 4 and increases pattern feature size uniformity 446 of FIG. 4.

The electron beam curing dose is controlled to a predetermined voltage and dose 270 of FIG. 2 of the electron beams to regulate voltage and dose duration based on type and thicknesses of imprinted resist materials, etch-resistant materials, hard mask layer and substrate. The reduced pattern feature placement drift errors and increased pattern feature size uniformity enables the magnetic diameter [nm] 930 of the pattern features to be optimized, including the maximized magnetic diameter [nm] 930 that produces the least coercivity and most signal amplitude of the substrate magnetic features etched using the hard mask patterned template 460 of FIG. 4. The pattern features size uniformity narrows magnetic dots switching field distribution and the pattern features placement accuracy reduces "jitter" during signal read-back.

Figure 10A:
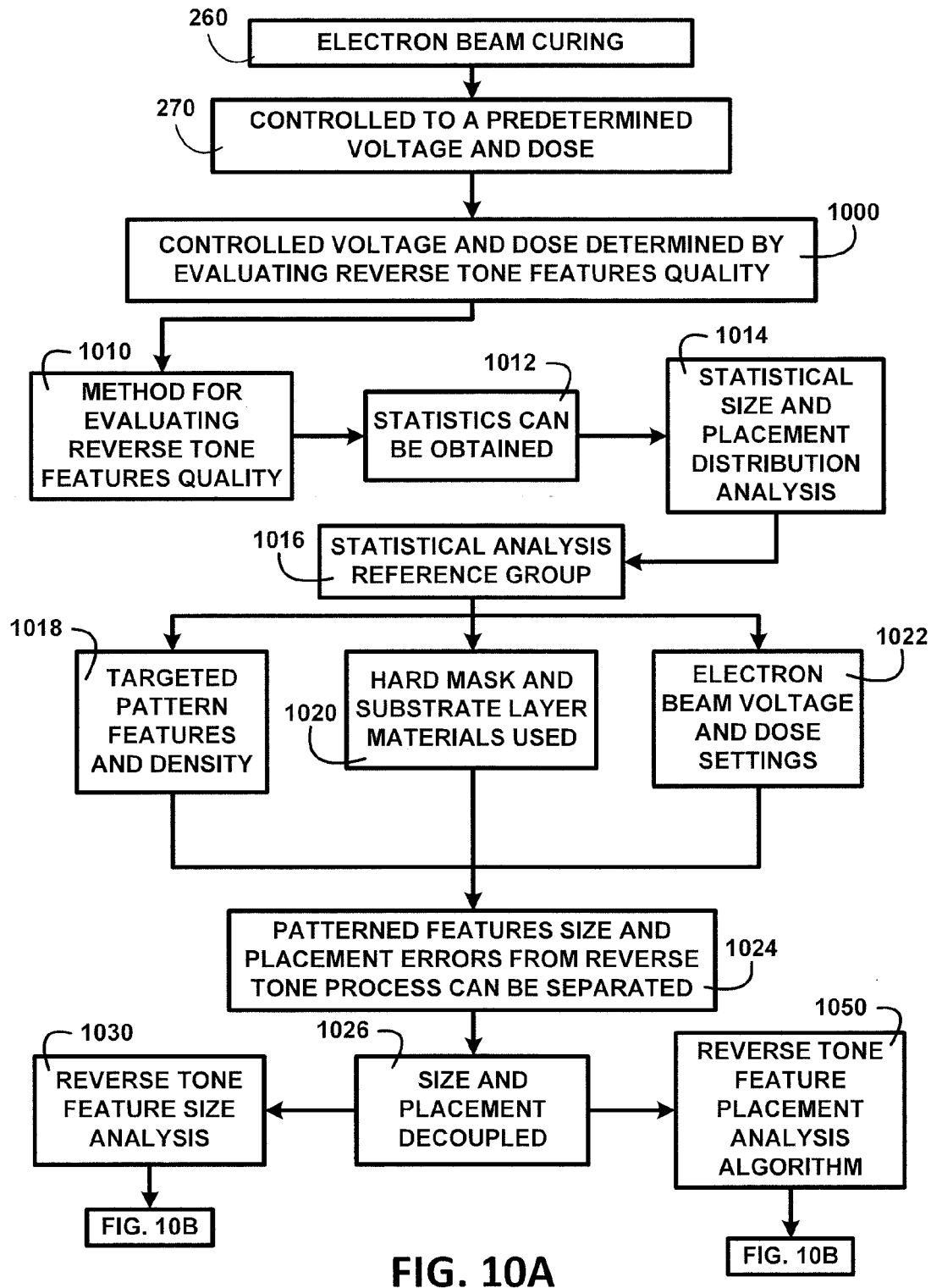
FIG. 10A shows for illustrative purposes only an example of a controlled predetermined voltage and dose determination method of one embodiment.

Predetermined Voltage and Dose:

FIG. 10A shows for illustrative purposes only an example of a controlled predetermined voltage and dose determination method of one embodiment. FIG. 10A shows the electron beam curing 260 is controlled to a predetermined voltage and dose 270. Controlled voltage and dose are determined by evaluating reverse tone features quality 1000 assures the quality of the products produced. A method for evaluating reverse tone features quality 1010 is used to predetermine the voltage and dose used in the electron beam curing 260. The evaluation method uses analysis of electron beam curing 260 product results, for example bit-patterned media (BPM), where statistics can be obtained 1012.

A statistical size and placement distribution quality analysis 1014 is performed for each statistical analysis reference group 1016. The statistical analysis reference group 1016 includes targeted pattern features and density 1018, hard mask and substrate layer materials used 1020 and electron beam voltage and dose settings 1022. The quality of the size of the pattern features and placement of the patterned features are analyzed. Patterned features size and placement errors from reverse tone process can be separated 1024. The statistical size and placement distribution analysis 1014 is programmed to evaluate the size and placement decoupled 1026. One evaluation is a reverse tone feature size analysis 1030 which is described further in FIG. 10B. The other evaluation is a reverse tone feature placement analysis algorithm 1050 described further in FIG. 108 of one embodiment.

Figure 10B:
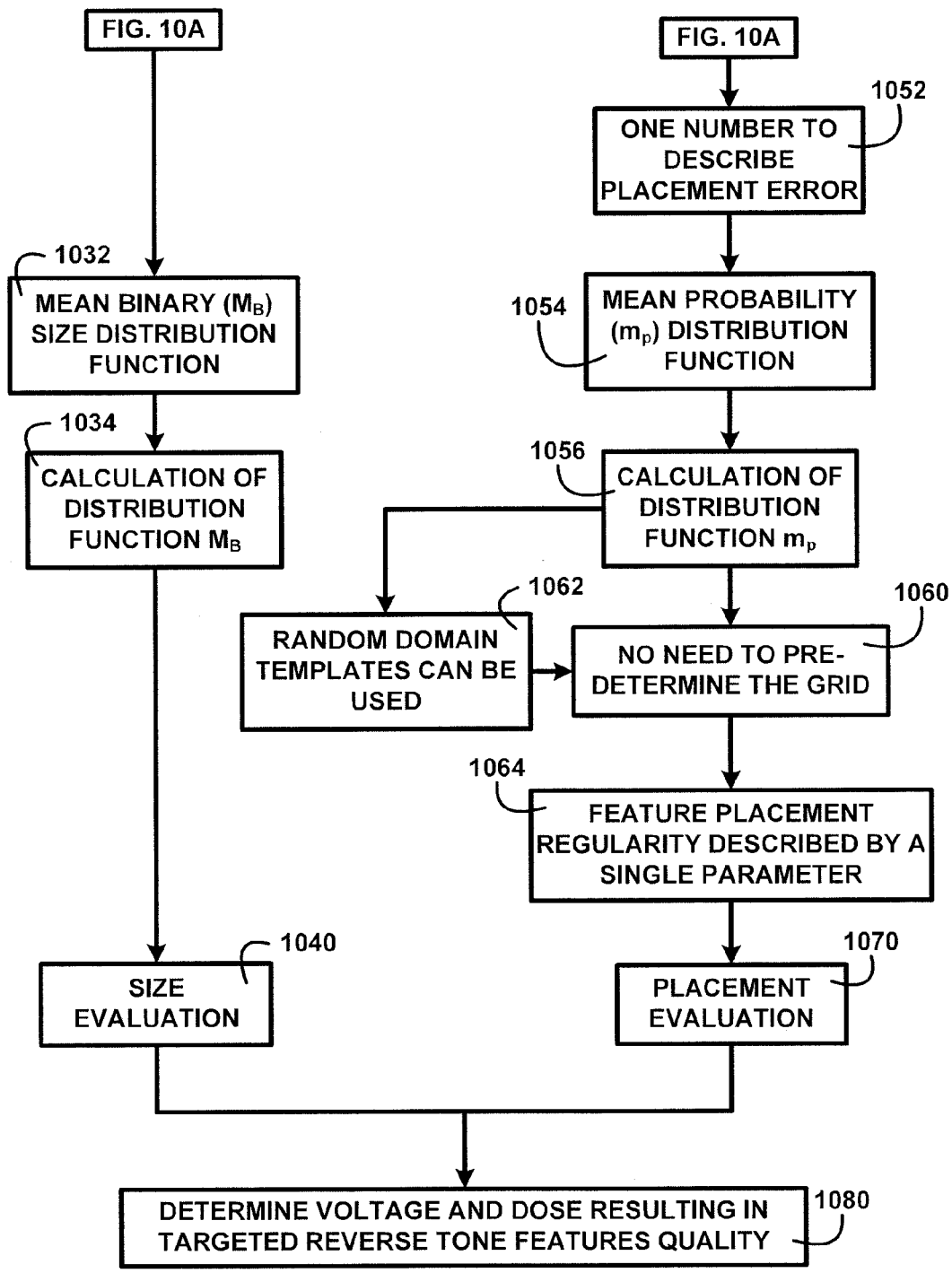
FIG. 10B shows for illustrative purposes only an example of a statistical size and placement distribution quality analysis of one embodiment.

Size and Placement Distribution Analysis:

FIG. 10B shows for illustrative purposes only an example of a statistical size and placement distribution quality analysis of one embodiment. FIG. 10B shows the continuation of the descriptions of the statistical size and placement distribution quality analysis 1014 of FIG. 10A. The reverse tone feature size analysis 1030 of FIG. 10A includes a mean binary ($M_B$) size distribution function 1032. A calculation of distribution function $M_B$ 1034 used in a size evaluation 1040. The size evaluation 1040 is used in the assessment of the targeted pattern features and density 1018 of FIG. 10A quality achieved for the electron beam voltage and dose settings 1022 of FIG. 10A used on the etch-resistant materials.

FIG. 10B shows a description of the reverse tone feature placement analysis algorithm 1050 of FIG. 10A which develops one number to describe placement error 1052. The one number to describe placement error 1052 is arrived using a mean probability ($m_p$) distribution function 1054. A calculation of distribution function $m_p$ 1056 is programmed wherein random domain templates can be used 1062 with no need to pre-determine the grid 1060. The result of the calculation of distribution function $m_p$ 1056 quantifies feature placement regularity described by a single parameter 1064. The feature placement regularity described by a single parameter 1064 is used in a placement evaluation 1070 to assess of the quality of the targeted pattern features and density 1018 of FIG. 10A reached for the electron beam voltage and dose settings 1022 of FIG. 10A used on the etch-resistant materials. The joint results of the size evaluation 1030 and placement evaluation 1070 are used to determine voltage and dose resulting in targeted reverse tone features quality 1080 of one embodiment.

Figure 11:
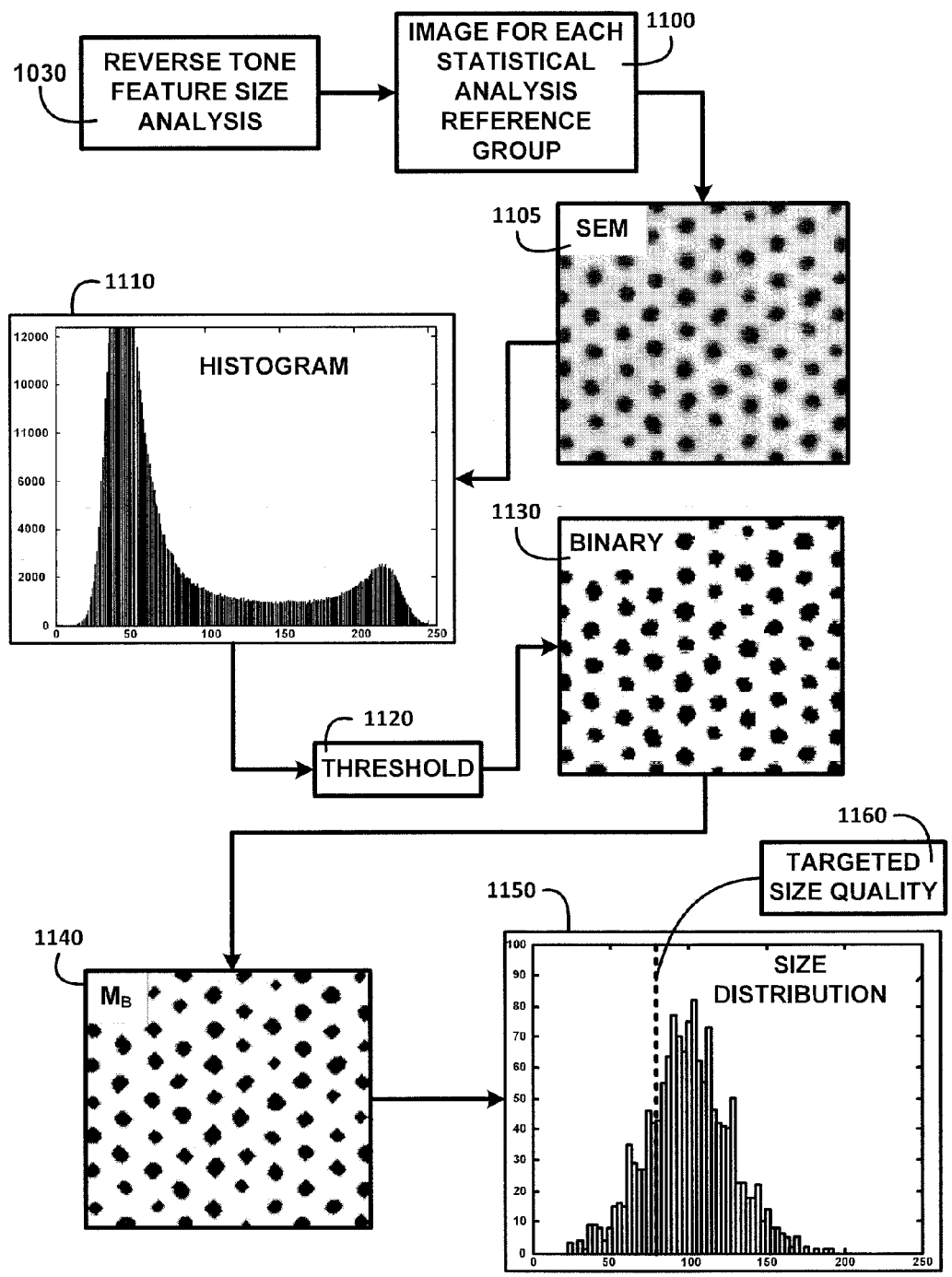
FIG. 11 shows for illustrative purposes only an example of feature size distribution of one embodiment.

Feature Size Distribution:

FIG. 11 shows for illustrative purposes only an example of feature size distribution of one embodiment. FIG. 11 shows the reverse tone feature size analysis 1030 which uses a sample image for each statistical analysis reference group 1100 electron beam curing process result obtained using a scanning electron microscope (SEM) of one embodiment.

The data collected in the histogram 1110 is an analysis of the brightness of all the pixels in the original SEM image of the features for example dots. The histogram 1110 distribution (horizontal axis) is from 0 to 255 to correspond to a gray scale for example a 256-level brightness. The histogram 1110 distribution (horizontal axis) is used to set the brightness "threshold" to turn the original gray-scale (0-255) image into a binary image (0 and 1) that is used to determine a size (brightness) threshold 1120. The threshold 1120 is used as a filter to create binary 1130 feature size data from the SEM 1105. The binary 1130 is used to create $M_B$ 1140 a binary representation of the SEM 1105. The $M_B$ 1140 is a filtered and "smoothened" version of the binary 1130 through several image processing operations to make the size calculation more stable. In binary 1130 there are smaller dots near the large dots, these small dots may be interpreted by computer as individual dots, that's why filtering is applied to "smoothen" the binary 1130 image. The $M_B$ 1140 data is shown as a size distribution 1150 which is compared to a targeted size quality 1160 as a basis for a size evaluation of one embodiment.

Figure 12:
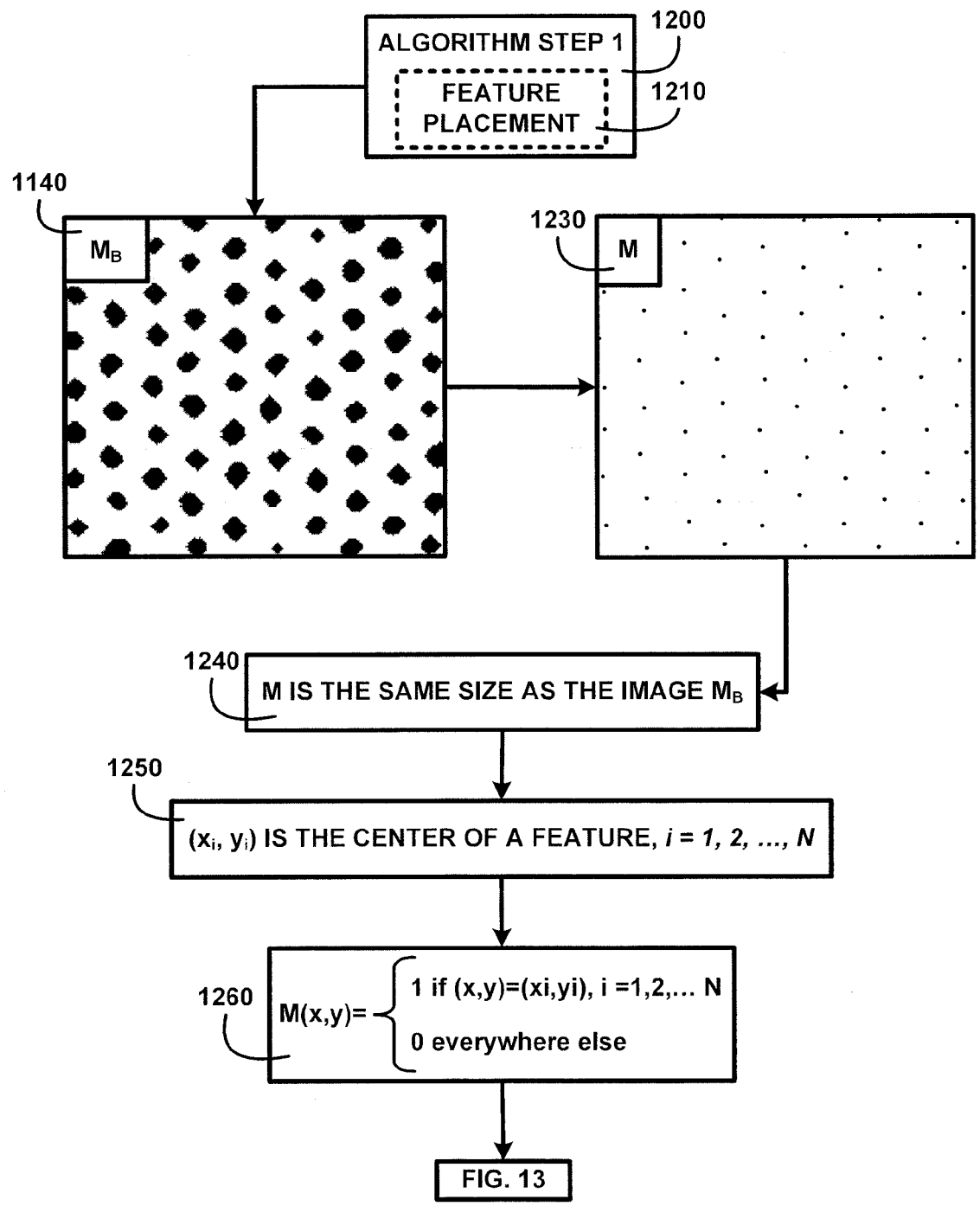
FIG. 12 shows for illustrative purposes only an example of evaluating reverse tone electron beam curing feature placement of one embodiment.

Feature Placement Evaluation:

FIG. 12 shows for illustrative purposes only an example of evaluating reverse tone electron beam curing feature placement of one embodiment. The placement of the features can affect for example ultimate read/write functioning quality of the features in for example BPM. FIG. 12 shows algorithm step 1 1200 used in analyzing feature placement 1210 in the reverse tone feature placement analysis algorithm 1050 of FIG. 10A. The $M_B$ 1140 is used to create M 1230 where M is the same size as the image $M_B$ 1240. M 1230 includes points where the points represent $(x_i, y_i)$ and $(x_i, y_i)$ is the center of a feature, i=1, N 1250. The analysis of M 1230 includes $M(x,y)=1$ if $(x,y)=(x_i,y_i)$, i=1, 2, ... N and 0 everywhere else 1260. Additional descriptions of the evaluation follow in FIG. 13 of one embodiment.

Figure 13:
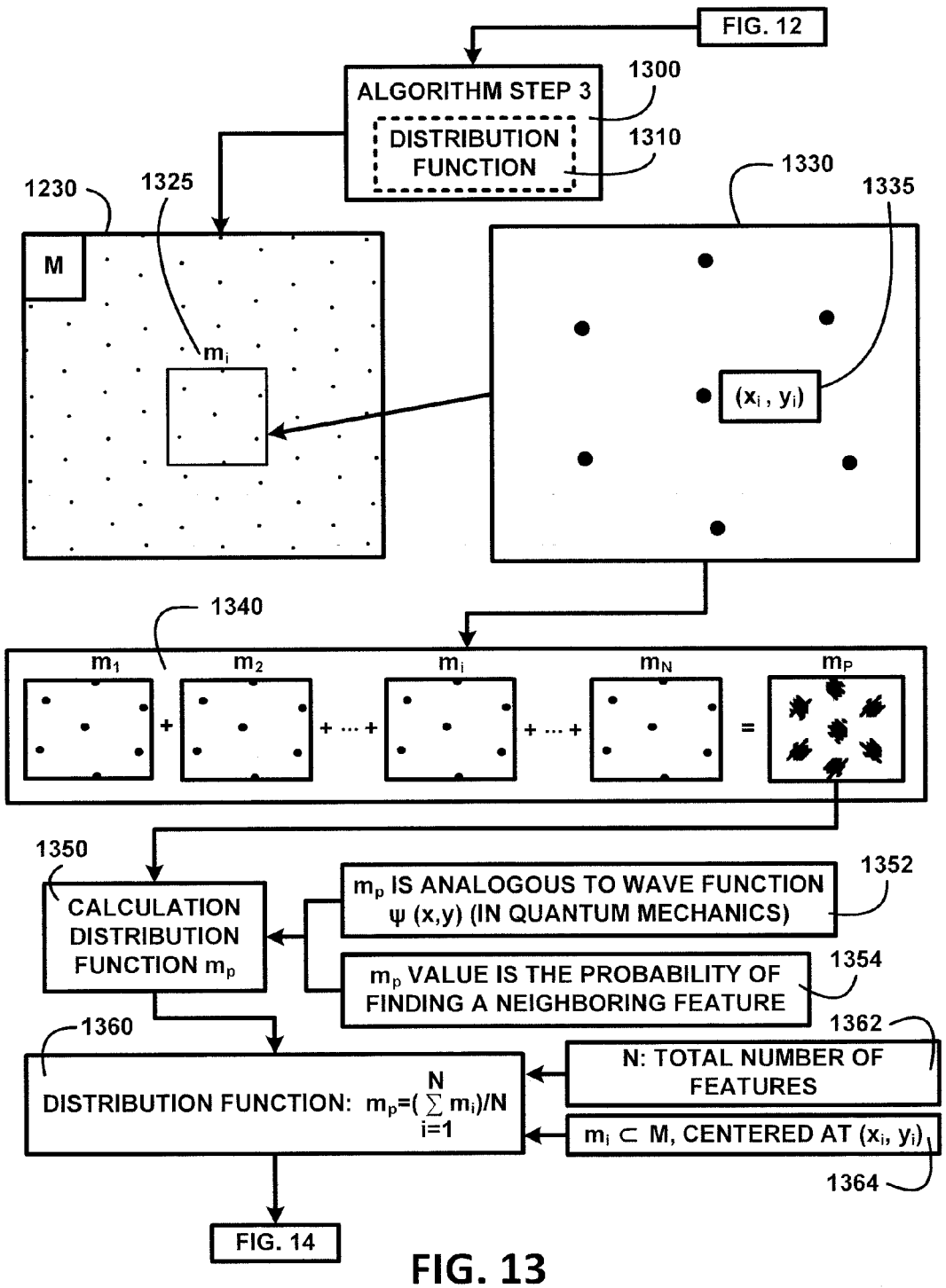
FIG. 13 shows for illustrative purposes only an example of a placement distribution function of one embodiment.

Placement Distribution Function:

FIG. 13 shows for illustrative purposes only an example of a placement distribution function of one embodiment. FIG. 13 shows the continuation of the process from FIG. 12. An algorithm step 3 1300 is used to perform a distribution function 1310. M 1230 has in window $m_i$ 1325 showing the random domain area used in this distribution function 1310. An enlargement of $m_i$ 1325 is shown in $m_i$ feature placements 1330. Included in the $m_i$ feature placements 1330 is $(x_i, y_i)$ 1335 which equals $m_i$ 1325 center point coordinates. The collection of coordinate points is shown in $m_p$ placement data 1340. A calculation distribution function $m_p$ 1350 wherein $m_p$ is analogous to a wave function $\Psi(x,y)$ (in quantum mechanics) 1352. An $m_p$ value is the probability of finding a neighboring feature 1354 for the targeted pattern features and density 1018 of FIG. 10A. A distribution function: $m_p = \Sigma_{i=1}^{N} m_i / N$ 1360 includes a value for N: total number of features 1362 and where $m_i \subset M$, centered at $(x_i, y_i)$ 1364. The placement distribution process continues and is described further in FIG. 14 of one embodiment.

Figure 14:
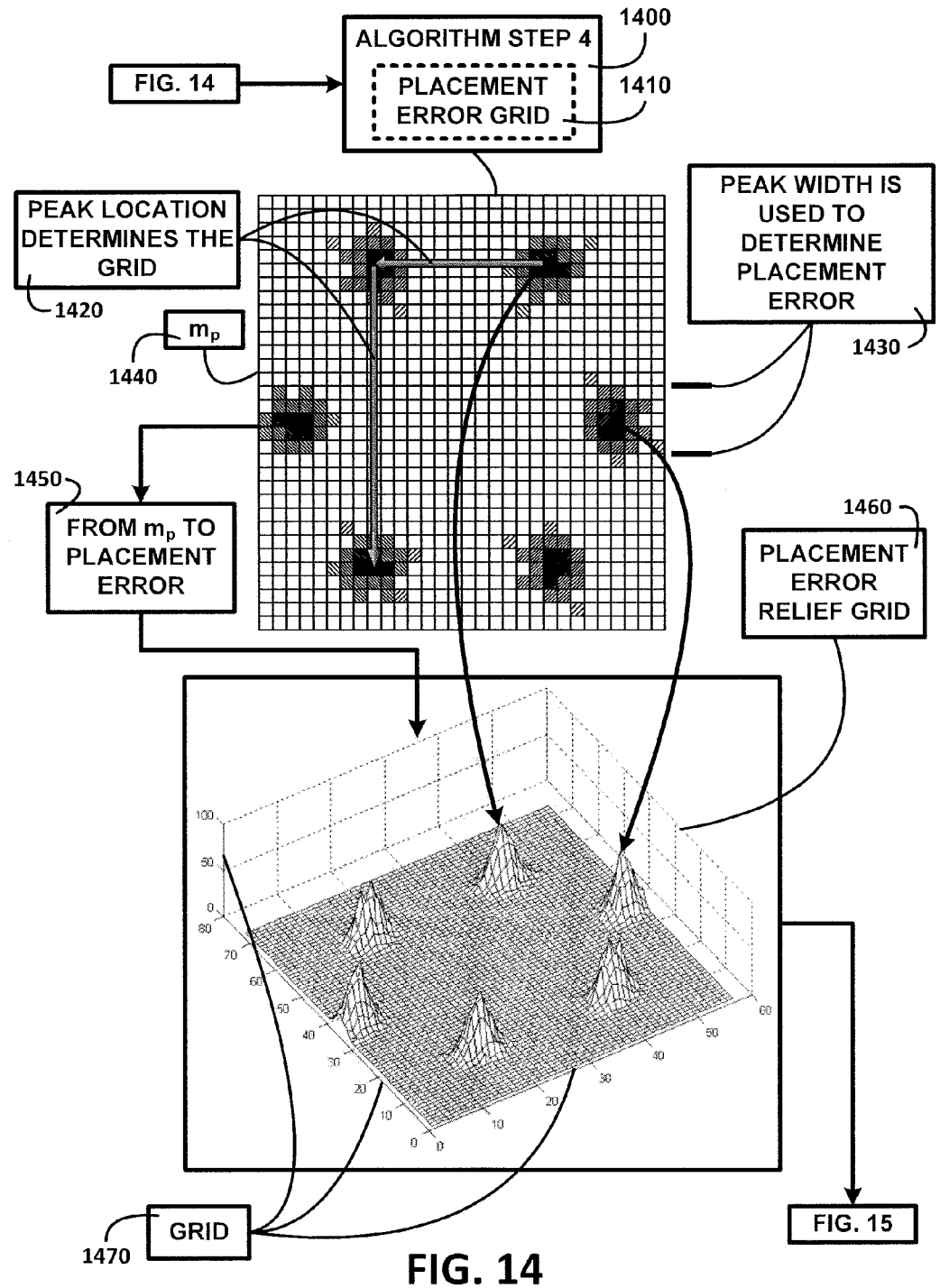
FIG. 14 shows for illustrative purposes only an example of a placement error grid of one embodiment.

Placement Error Grid:

FIG. 14 shows for illustrative purposes only an example of a placement error grid of one embodiment. FIG. 14 shows the continuation of the placement error determination from FIG. 13. FIG. 14 includes algorithm step 4 1400 used to create a placement error grid 1410. Random domain templates can be used 1062 of FIG. 10B where there is no need to pre-determine the grid 1060 of FIG. 10B. A peak location determines the grid 1420 increments and peak width is used to determine placement error 1430. The grid 1470 includes the x-y coordinates of "pixels", the small squares in the x-y plane corresponding to the pixels in the original image. The grid 1470 includes vertical z-coordinates which are "counts" corresponding to how many neighboring dots are found at the particular pixel location. The x, y and z coordinates are used to create $m_p$ 1440. The $m_p$ 1440 data is used to transition from $m_p$ to placement error 1450 quantification as one number. A placement error relief grid 1460 shows a three dimensional (3D) representation of the grid 1470. Additional steps are described in FIG. 15 of one embodiment.

Figure 15:
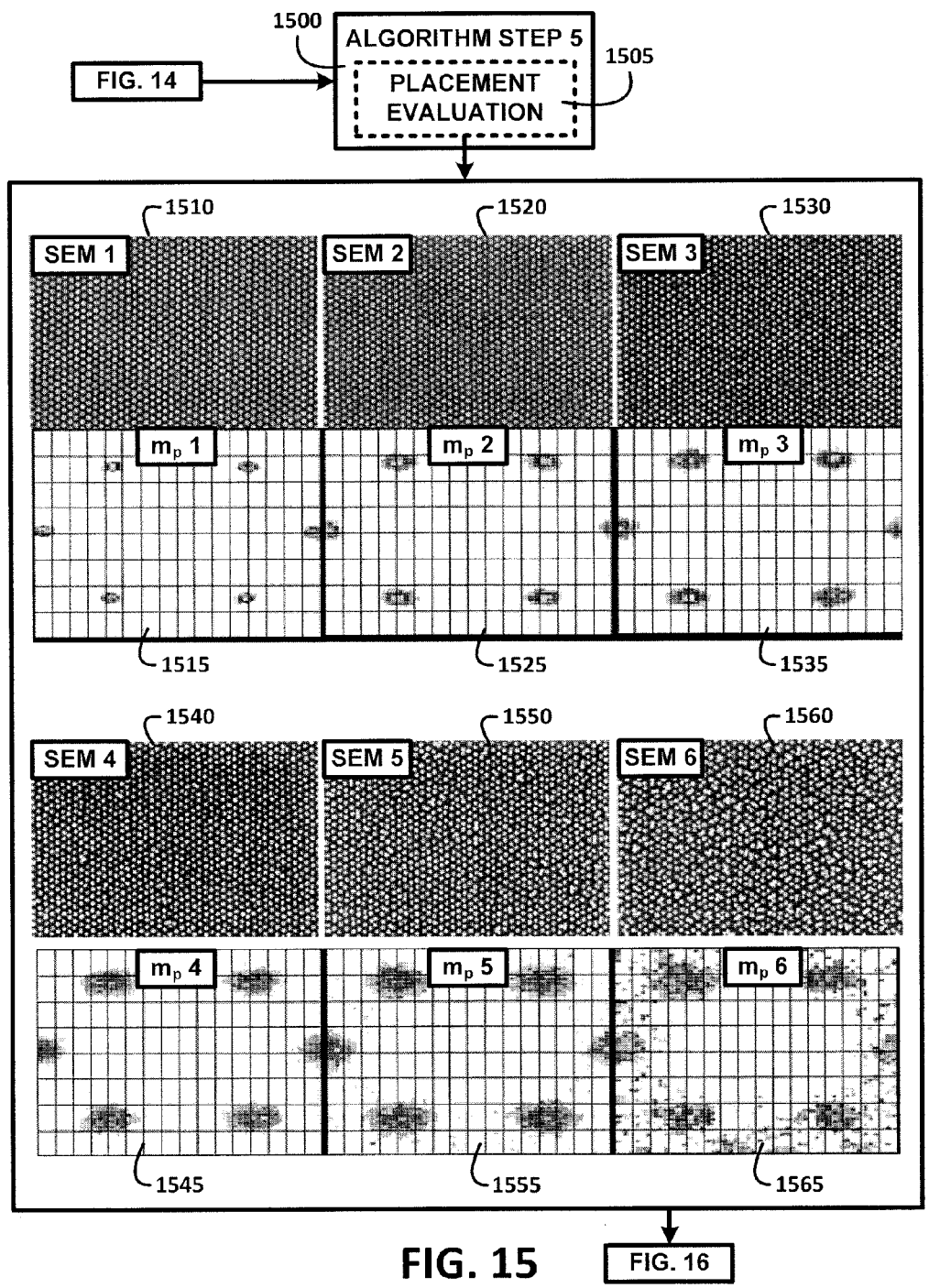
FIG. 15 shows for illustrative purposes only an example of placement evaluation of one embodiment.

Placement Evaluation:

FIG. 15 shows for illustrative purposes only an example of placement evaluation of one embodiment. FIG. 15 shows the continuing process from FIG. 14 including algorithm step 5 1500. Algorithm step 5 1500 is used for placement evaluation 1505 of the images of the random domain templates. The images include in this example SEM 1 1510, SEM 2 1520, SEM 3 1530, SEM 4 1540, SEM 5 1550 and SEM 6 1560. Corresponding to the images are $m_p$ 1 1515, $m_p$ 2 1525, $m_p$ 3 1535, $m_p$ 4 1545, $m_p$ 5 1555 and $m_p$ 6 1565. The $m_p$ grids show how the placements can vary with different electron beam curing voltage and dose settings. The evaluations performed are used to determine which settings produce the targeted results. The further evaluation is described in FIG. 16 of one embodiment.

Figure 16:
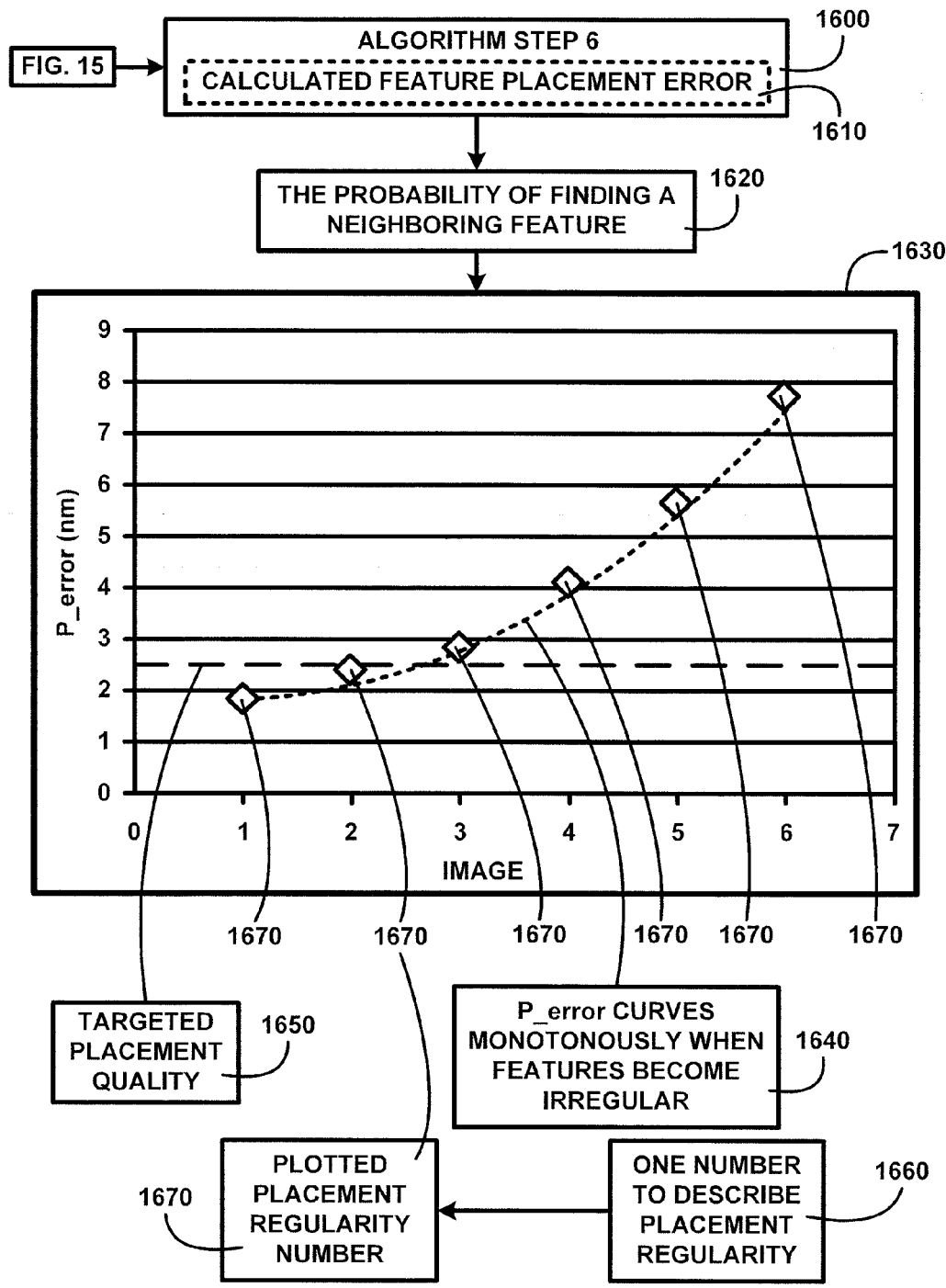
FIG. 16 shows for illustrative purposes only an example of plotted placement regularity numbers of one embodiment.

Plotted Placement Regularity Number:

FIG. 16 shows for illustrative purposes only an example of plotted placement regularity numbers of one embodiment. FIG. 16 shows a continuance of the process from FIG. 15 including algorithm step 6 1600. Algorithm step 6 1600 is used to determine each calculated feature placement error 1610. The calculated feature placement error 1610 is used to determine the probability of finding a neighboring feature 1620. The calculated feature placement error plotting 1630 charts the feature placement error for each image based on the P_error (nm). The P_error (nm) is one number to describe placement regularity 1660. Each plotted placement regularity number 1670 for images 1-6 can create a curved output. A P_error curves monotonously when features become irregularly placed 1640. The results are used to compare to a targeted placement quality 1650 for the placement evaluation 1070 of FIG. 10B.

The foregoing has described the principles, embodiments and modes of operation of the present invention. However, the invention should not be construed as being limited to the particular embodiments discussed. The above described embodiments should be regarded as illustrative rather than restrictive, and it should be appreciated that variations may be made in those embodiments by workers skilled in the art without departing from the scope of the present invention as defined by the following claims.

What is claimed is:

1. A method, comprising:
   depositing an etch-resistant material over an imprinted resist, wherein the etch-resistant material fills patterned features within the imprinted resist and covers exposed surfaces of a hard mask layer;
   curing the etch-resistant material to form a cured-etch-resistant material, wherein the curing is controlled to decrease volume, increase refractive index, and increase density of the cured-etch-resistant material with respect to the etch-resistant material;
   etching the cured-etch-resistant material and the imprinted resist, wherein
   the etching creates etched-cured-etch-resistant material, and
   the etching creates etched-imprinted resist;
   etching the etched-imprinted resist and the hard mask layer down to a substrate, wherein the etched-imprinted resist is removed; and
   removing the etched-cured-etch-resistant material.

2. The method of claim 1,
   wherein curing the etch resistant material comprises irradiating a spin-on-glass composition with a 2-keV electron beam.

3. The method of claim 1,
   wherein curing the etch resistant material comprises irradiating a spin-on-glass composition with an electron beam at a curing dose of approximately 1000-50,000 $\mu C/cm^2$.

4. The method of claim 1,
   wherein the etch resistant material comprises hydrogen silsesquioxane.

5. The method of claim 1,
   wherein the etch resistant material comprises hydrogen silsesquioxane, and
   wherein curing the etch resistant material effects a cage-to-network structural transformation of the hydrogen silsesquioxane, thereby increasing density and etch resistance of the etch resistant material.

6. The method of claim 1,
   wherein the etch resistant material comprises hydrogen silsesquioxane,
   wherein the imprinted resist comprises a UV-cured organic resist, and
   wherein the hard mask layer comprises carbon.

7. The method of claim 1,
   wherein etching cured-etch-resistant material comprises reactive ion etching with $CF_4$.

8. The method of claim 1,
   wherein etching the etched-imprinted resist and the hard mask layer comprises reactive ion etching with $O_2$.

9. The method of claim 1,
   wherein removing the etched-cured-etch-resistant material leaves a patterned mask comprising more than $1 \times 10^{12}$ features per square inch.

10. A method, comprising:
    depositing an etch-resistant material within imprinted resist features and covering exposed surfaces of a hard mask layer, wherein the imprinted resist features are inverted tapering pillars;
    curing the etch-resistant material to form a cured-etch-resistant material, wherein the curing wherein the curing increases mechanical stability of the etch-resistant material;
    etching the cured-etch-resistant material and the imprinted resist;
    etching the imprinted resist again and the hard mask layer down to a substrate, wherein the imprinted resist is removed; and
    removing the cured-etch-resistant material to leave a patterned hard mask layer on the substrate.

11. The method of claim 10,
    wherein the etch-resistant material comprises hydrogen silsesquioxane.

12. The method of claim 10,
    wherein curing the etch-resistant material comprises irradiating a spin-on-glass composition with an about 2-keV electron beam.

13. The method of claim 10,
    wherein etching the cured-etch-resistant material provides larger-sized features in the patterned hard mask layer than etching an uncured-etch-resistant material.

14. A method, comprising:
    depositing an etch-resistant material over an imprinted resist, wherein the etch-resistant material fills patterned features within the imprinted resist and covers exposed surfaces of a hard mask layer;
    etching the etch-resistant material and the imprinted resist, wherein
    the etching creates etched-etch-resistant material, and
    the etching creates etched-imprinted resist;
    curing the etched-etch-resistant material to form a cured-etched-etch-resistant material, wherein the curing is controlled to decrease volume, increase refractive index, and increase density of the cured-etched-etch-resistant material with respect to the etched-etch-resistant material;
    etching the etched-imprinted resist and the hard mask layer down to a substrate, wherein the etched-imprinted resist is removed; and
    removing the cured-etched-etch-resistant material.

15. The method of claim 14,
    wherein etching the etch-resistant material and the imprinted resist comprises reactive ion etching with $CF_4$, and
    wherein etching the etched-imprinted resist and the hard mask layer comprises reactive ion etching with $O_2$.

16. The method of claim 14,
    wherein the etch-resistant material comprises hydrogen silsesquioxane.

17. The method of claim 14,
    wherein curing the etched-etch-resistant material comprises irradiating the etched-etch-resistant material with an electron beam at a curing dose of approximately 2000 $\mu C/cm^2$.

* * * * *